US008546742B2

(12) United States Patent
Wober

(10) Patent No.: US 8,546,742 B2
(45) Date of Patent: Oct. 1, 2013

(54) ARRAY OF NANOWIRES IN A SINGLE CAVITY WITH ANTI-REFLECTIVE COATING ON SUBSTRATE

(75) Inventor: Munib Wober, Topsfield, MA (US)

(73) Assignee: Zena Technologies, Inc., Cambridge, MA (US)

( * ) Notice: Subject to any disclaimer, the term of this patent is extended or adjusted under 35 U.S.C. 154(b) by 398 days.

(21) Appl. No.: 12/478,598

(22) Filed: Jun. 4, 2009

(65) Prior Publication Data

US 2010/0308214 A1 Dec. 9, 2010

(51) Int. Cl.
*G01J 1/04* (2006.01)
*G01N 21/25* (2006.01)
*G02B 6/02* (2006.01)
*H01L 27/00* (2006.01)

(52) U.S. Cl.
USPC .............. 250/227.14; 250/227.23; 250/208.1; 385/123

(58) Field of Classification Search
USPC ............ 250/208.1, 226, 227.2, 214.1, 214 R, 250/227.23, 216, 239, 227.14; 348/164, 348/294, 302, 309; 257/257, 258, 290–294, 257/428–466; 385/123, 14, 12, 124; 977/762, 977/953, 954
See application file for complete search history.

(56) References Cited

U.S. PATENT DOCUMENTS

| | | | |
|---|---|---|---|
| 1,918,848 A | 4/1929 | Land | |
| 3,903,427 A | 9/1975 | Pack | |
| 4,017,332 A | 4/1977 | James | |
| 4,387,265 A | 6/1983 | Dalal | |
| 4,400,221 A | 8/1983 | Rahilly | |
| 4,443,890 A | 4/1984 | Eumurian | |
| 4,513,168 A | 4/1985 | Borden | |
| 4,827,335 A | 5/1989 | Saito | |
| 4,880,613 A | 11/1989 | Satoh | |
| 4,896,941 A | 1/1990 | Hayashi | |
| 4,950,625 A | 8/1990 | Nakashima | |
| 4,971,928 A | 11/1990 | Fuller | |
| 4,972,244 A | 11/1990 | Buffet | |

(Continued)

FOREIGN PATENT DOCUMENTS

| | | |
|---|---|---|
| JP | 2002151715 | 5/2002 |
| JP | 2005252210 | 9/2005 |

(Continued)

OTHER PUBLICATIONS

International Search Report and Written Opinion for PCT International Patent Application No. PCT/US2010/035727, mailed Sep. 27, 2010.

(Continued)

*Primary Examiner* — Que T Le
*Assistant Examiner* — Jennifer Bennett
(74) *Attorney, Agent, or Firm* — Pillsbury Winthrop Shaw Pittman LLP

(57) ABSTRACT

An embodiment relates to image sensor comprising one or more nanowires on a substrate of a cavity, the nanowire being configured to transmit a first portion of an electromagnetic radiation beam incident on the sensor, and the substrate that absorbs a second portion of the electromagnetic radiation beam incident on the sensor, wherein the first portion is substantially different from the second portion. The substrate could have a anti-reflective material. The ratio of a diameter of the cavity to a diameter of the nanowire could be at less than about 10.

40 Claims, 7 Drawing Sheets

(56) References Cited

U.S. PATENT DOCUMENTS

| | | | |
|---|---|---|---|
| 5,096,520 | A | 3/1992 | Faris |
| 5,124,543 | A | 6/1992 | Kawashima |
| 5,272,518 | A | 12/1993 | Vincent |
| 5,311,047 | A | 5/1994 | Chang |
| 5,347,147 | A | 9/1994 | Jones |
| 5,362,972 | A | 11/1994 | Yazawa |
| 5,401,968 | A | 3/1995 | Cox |
| 5,449,626 | A | 9/1995 | Hezel |
| 5,468,652 | A | 11/1995 | Gee |
| 5,602,661 | A | 2/1997 | Schadt |
| 5,612,780 | A | 3/1997 | Rickenbach |
| 5,723,945 | A | 3/1998 | Schermerhorn |
| 5,747,796 | A | 5/1998 | Heard |
| 5,767,507 | A | 6/1998 | Unlu |
| 5,798,535 | A | 8/1998 | Huang |
| 5,853,446 | A | 12/1998 | Carre |
| 5,877,492 | A | 3/1999 | Fujieda |
| 5,880,495 | A | 3/1999 | Chen |
| 5,900,623 | A | 5/1999 | Tsang et al. |
| 5,943,463 | A | 8/1999 | Unuma |
| 6,033,582 | A | 3/2000 | Lee |
| 6,037,243 | A | 3/2000 | Ha et al. |
| 6,046,466 | A | 4/2000 | Ishida et al. |
| 6,074,892 | A | 6/2000 | Bowers et al. |
| 6,100,551 | A | 8/2000 | Lee |
| 6,270,548 | B1 | 8/2001 | Campbell |
| 6,326,649 | B1 | 12/2001 | Chang et al. |
| 6,388,243 | B1 | 5/2002 | Berezin |
| 6,388,648 | B1 | 5/2002 | Clifton |
| 6,459,034 | B2 | 10/2002 | Muramoto et al. |
| 6,542,231 | B1 | 4/2003 | Garrett |
| 6,566,723 | B1 | 5/2003 | Vook |
| 6,680,216 | B2 | 1/2004 | Kwasnick et al. |
| 6,709,929 | B2 | 3/2004 | Zhang |
| 6,720,594 | B2 | 4/2004 | Rahn |
| 6,771,314 | B1 | 8/2004 | Bawolek |
| 6,805,139 | B1 | 10/2004 | Savas |
| 6,812,473 | B1 | 11/2004 | Amemiya |
| 6,927,145 | B1 | 8/2005 | Yang |
| 6,960,526 | B1 | 11/2005 | Shah |
| 6,967,120 | B2 | 11/2005 | Jang |
| 6,969,899 | B2 | 11/2005 | Yaung |
| 6,987,258 | B2 | 1/2006 | Mates |
| 6,996,147 | B2 | 2/2006 | Majumdar |
| 7,052,927 | B1 | 5/2006 | Fletcher |
| 7,105,428 | B2 | 9/2006 | Pan |
| 7,109,517 | B2 | 9/2006 | Zaidi |
| 7,153,720 | B2 | 12/2006 | Augusto |
| 7,163,659 | B2 | 1/2007 | Stasiak et al. |
| 7,208,783 | B2 * | 4/2007 | Palsule et al. .................. 257/233 |
| 7,230,286 | B2 | 6/2007 | Cohen |
| 7,235,475 | B2 | 6/2007 | Kamins |
| 7,241,434 | B2 | 7/2007 | Anthony |
| 7,254,151 | B2 | 8/2007 | Lieber |
| 7,262,400 | B2 | 8/2007 | Yaung |
| 7,265,328 | B2 | 9/2007 | Mouli |
| 7,285,812 | B2 | 10/2007 | Tang et al. |
| 7,306,963 | B2 | 12/2007 | Linden |
| 7,307,327 | B2 | 12/2007 | Bahl |
| 7,311,889 | B2 | 12/2007 | Awano |
| 7,330,404 | B2 | 2/2008 | Peng |
| 7,335,962 | B2 | 2/2008 | Mouli |
| 7,336,860 | B2 | 2/2008 | Cyr |
| 7,358,583 | B2 | 4/2008 | Reznik |
| 7,446,025 | B2 | 11/2008 | Cohen |
| 7,462,774 | B2 | 12/2008 | Roscheisen |
| 7,471,428 | B2 | 12/2008 | Ohara |
| 7,491,269 | B2 | 2/2009 | Legagneux |
| 7,521,322 | B2 | 4/2009 | Tang et al. |
| 7,598,482 | B1 | 10/2009 | Verhulst |
| 7,622,367 | B1 | 11/2009 | Nuzzo |
| 7,646,138 | B2 | 1/2010 | Williams |
| 7,646,943 | B1 | 1/2010 | Wober |
| 7,647,695 | B2 | 1/2010 | MacNutt |
| 7,655,860 | B2 | 2/2010 | Parsons |
| 7,663,202 | B2 | 2/2010 | Wang et al. |
| 7,704,806 | B2 | 4/2010 | Chae |
| 7,713,779 | B2 | 5/2010 | Firon |
| 7,719,688 | B2 | 5/2010 | Kamins |
| 7,732,839 | B2 | 6/2010 | Sebe |
| 7,736,954 | B2 | 6/2010 | Hussain |
| 7,740,824 | B2 | 6/2010 | Godfried |
| 7,790,495 | B2 | 9/2010 | Assefa et al. |
| 7,888,155 | B2 | 2/2011 | Chen |
| 8,030,729 | B2 * | 10/2011 | Quitoriano et al. ............ 257/461 |
| 8,035,184 | B1 | 10/2011 | Dutta et al. |
| 8,063,450 | B2 | 11/2011 | Wernersson et al. |
| 8,084,728 | B2 * | 12/2011 | Tsang ......................... 250/208.1 |
| 8,093,675 | B2 | 1/2012 | Tsunemi et al. |
| 8,242,353 | B2 | 8/2012 | Karg |
| 8,269,985 | B2 * | 9/2012 | Wober ........................... 356/625 |
| 8,274,039 | B2 * | 9/2012 | Wober et al. .............. 250/227.14 |
| 8,299,472 | B2 | 10/2012 | Yu et al. |
| 8,384,007 | B2 | 2/2013 | Yu et al. |
| 2002/0020846 | A1 | 2/2002 | Pi et al. |
| 2002/0104821 | A1 | 8/2002 | Bazylenko et al. |
| 2002/0109082 | A1 | 8/2002 | Nakayama |
| 2002/0172820 | A1 * | 11/2002 | Majumdar et al. ............ 428/357 |
| 2003/0003300 | A1 | 1/2003 | Korgel |
| 2003/0006363 | A1 | 1/2003 | Campbell |
| 2003/0077907 | A1 | 4/2003 | Kao et al. |
| 2003/0089899 | A1 | 5/2003 | Lieber |
| 2003/0103744 | A1 | 6/2003 | Koyama |
| 2003/0132480 | A1 | 7/2003 | Chau |
| 2003/0189202 | A1 | 10/2003 | Li |
| 2003/0227090 | A1 | 12/2003 | Okabe |
| 2004/0026684 | A1 | 2/2004 | Empedocles |
| 2004/0058058 | A1 | 3/2004 | Shchegolikhin |
| 2004/0065362 | A1 | 4/2004 | Watabe |
| 2004/0075464 | A1 | 4/2004 | Samuelson |
| 2004/0109666 | A1 * | 6/2004 | Kim, II .......................... 385/147 |
| 2004/0118337 | A1 | 6/2004 | Mizutani |
| 2004/0122328 | A1 | 6/2004 | Wang |
| 2004/0124366 | A1 | 7/2004 | Zeng |
| 2004/0155247 | A1 | 8/2004 | Benthien |
| 2004/0180461 | A1 | 9/2004 | Yaung et al. |
| 2004/0213307 | A1 | 10/2004 | Lieber |
| 2004/0217086 | A1 | 11/2004 | Kawashima |
| 2004/0223681 | A1 | 11/2004 | Block |
| 2004/0241965 | A1 | 12/2004 | Merritt |
| 2005/0082676 | A1 | 4/2005 | Andry |
| 2005/0095699 | A1 | 5/2005 | Miyauchi et al. |
| 2005/0116271 | A1 | 6/2005 | Kato |
| 2005/0133476 | A1 | 6/2005 | Islam |
| 2005/0190453 | A1 | 9/2005 | Dobashi |
| 2005/0201704 | A1 | 9/2005 | Ellwood, Jr. |
| 2005/0218468 | A1 | 10/2005 | Owen |
| 2005/0284517 | A1 | 12/2005 | Shinohara |
| 2006/0038990 | A1 | 2/2006 | Habib et al. |
| 2006/0113622 | A1 | 6/2006 | Adkisson |
| 2006/0121371 | A1 | 6/2006 | Wu |
| 2006/0146323 | A1 | 7/2006 | Bratkovski |
| 2006/0260674 | A1 | 11/2006 | Tran |
| 2006/0273262 | A1 | 12/2006 | Sayag |
| 2006/0273389 | A1 | 12/2006 | Cohen |
| 2006/0284118 | A1 | 12/2006 | Asmussen |
| 2007/0012980 | A1 | 1/2007 | Duan et al. |
| 2007/0012985 | A1 | 1/2007 | Stumbo et al. |
| 2007/0023799 | A1 | 2/2007 | Boettiger |
| 2007/0025504 | A1 | 2/2007 | Tumer |
| 2007/0029545 | A1 | 2/2007 | Striakhilev |
| 2007/0052050 | A1 | 3/2007 | Dierickx |
| 2007/0082255 | A1 | 4/2007 | Sun |
| 2007/0099292 | A1 | 5/2007 | Miller |
| 2007/0104441 | A1 | 5/2007 | Ahn et al. |
| 2007/0108371 | A1 | 5/2007 | Stevens |
| 2007/0114622 | A1 | 5/2007 | Adkisson |
| 2007/0120254 | A1 | 5/2007 | Hurkx et al. |
| 2007/0126037 | A1 | 6/2007 | Ikeda |
| 2007/0137697 | A1 | 6/2007 | Kempa |
| 2007/0138376 | A1 | 6/2007 | Naughton |
| 2007/0138380 | A1 * | 6/2007 | Adkisson et al. ........ 250/227.11 |
| 2007/0138459 | A1 | 6/2007 | Wong |
| 2007/0140638 | A1 | 6/2007 | Yang |

| | | |
|---|---|---|
| 2007/0145512 A1 | 6/2007 | Rhodes |
| 2007/0148599 A1 | 6/2007 | True |
| 2007/0152248 A1 | 7/2007 | Choi |
| 2007/0155025 A1 | 7/2007 | Zhang |
| 2007/0170418 A1 | 7/2007 | Bowers |
| 2007/0172623 A1 | 7/2007 | Kresse |
| 2007/0187787 A1* | 8/2007 | Ackerson et al. ............. 257/428 |
| 2007/0196239 A1 | 8/2007 | Vink |
| 2007/0200054 A1 | 8/2007 | Reznik |
| 2007/0205483 A1 | 9/2007 | Williams et al. |
| 2007/0217754 A1 | 9/2007 | Sasaki |
| 2007/0228421 A1 | 10/2007 | Shioya et al. |
| 2007/0238285 A1 | 10/2007 | Borden |
| 2007/0246689 A1 | 10/2007 | Ge et al. |
| 2007/0248958 A1 | 10/2007 | Jovanovich et al. |
| 2007/0272828 A1 | 11/2007 | Xu |
| 2007/0285378 A1 | 12/2007 | Lankhorst |
| 2007/0290193 A1 | 12/2007 | Tucker |
| 2007/0290265 A1* | 12/2007 | Augusto et al. ............... 257/351 |
| 2008/0001498 A1 | 1/2008 | Muller |
| 2008/0036038 A1 | 2/2008 | Hersee |
| 2008/0044984 A1 | 2/2008 | Hsieh |
| 2008/0047601 A1 | 2/2008 | Nag |
| 2008/0047604 A1 | 2/2008 | Korevaar et al. |
| 2008/0055451 A1 | 3/2008 | Kanbe |
| 2008/0073742 A1 | 3/2008 | Adkisson |
| 2008/0079022 A1 | 4/2008 | Yamamoto |
| 2008/0079076 A1 | 4/2008 | Sheen |
| 2008/0083963 A1 | 4/2008 | Hsu et al. |
| 2008/0088014 A1 | 4/2008 | Adkisson |
| 2008/0090401 A1 | 4/2008 | Bratkovski |
| 2008/0092938 A1 | 4/2008 | Majumdar |
| 2008/0096308 A1 | 4/2008 | Santori |
| 2008/0108170 A1 | 5/2008 | Adkisson |
| 2008/0116537 A1 | 5/2008 | Adkisson |
| 2008/0128760 A1 | 6/2008 | Jun |
| 2008/0145965 A1 | 6/2008 | Reznik |
| 2008/0149914 A1 | 6/2008 | Samuelson et al. |
| 2008/0149944 A1* | 6/2008 | Samuelson et al. ............. 257/88 |
| 2008/0166883 A1 | 7/2008 | Liu et al. |
| 2008/0169017 A1 | 7/2008 | Korevaar |
| 2008/0173615 A1 | 7/2008 | Kim |
| 2008/0188029 A1 | 8/2008 | Rhodes |
| 2008/0191278 A1 | 8/2008 | Maekawa |
| 2008/0191298 A1 | 8/2008 | Lin |
| 2008/0211945 A1 | 9/2008 | Hong |
| 2008/0218740 A1 | 9/2008 | Williams et al. |
| 2008/0224115 A1 | 9/2008 | Bakkers |
| 2008/0225140 A1 | 9/2008 | Raynor |
| 2008/0233280 A1 | 9/2008 | Blanchet |
| 2008/0237568 A1 | 10/2008 | Kobayashi |
| 2008/0246020 A1 | 10/2008 | Kawashima |
| 2008/0246123 A1 | 10/2008 | Kamins |
| 2008/0248304 A1 | 10/2008 | Hanrath |
| 2008/0251780 A1 | 10/2008 | Li |
| 2008/0258747 A1 | 10/2008 | Kluth |
| 2008/0283883 A1 | 11/2008 | Shim |
| 2008/0297281 A1 | 12/2008 | Ayazi |
| 2008/0311693 A1 | 12/2008 | Maxwell |
| 2008/0311712 A1 | 12/2008 | Anwat et al. |
| 2009/0032687 A1 | 2/2009 | Lapstun |
| 2009/0046749 A1 | 2/2009 | Mizuuchi |
| 2009/0050204 A1 | 2/2009 | Habib |
| 2009/0057650 A1 | 3/2009 | Lieber |
| 2009/0127442 A1 | 5/2009 | Lee |
| 2009/0146198 A1 | 6/2009 | Joe |
| 2009/0151782 A1 | 6/2009 | Ko |
| 2009/0152664 A1 | 6/2009 | Klem |
| 2009/0165844 A1 | 7/2009 | Dutta |
| 2009/0173976 A1 | 7/2009 | Augusto |
| 2009/0179289 A1 | 7/2009 | Park |
| 2009/0188552 A1 | 7/2009 | Wang |
| 2009/0189144 A1 | 7/2009 | Quitoriano |
| 2009/0189145 A1 | 7/2009 | Want et al. |
| 2009/0199597 A1 | 8/2009 | Danley |
| 2009/0201400 A1 | 8/2009 | Zhang et al. |
| 2009/0224245 A1 | 9/2009 | Umezaki |
| 2009/0233445 A1 | 9/2009 | Lee |
| 2009/0243016 A1 | 10/2009 | Kawahara et al. |
| 2009/0244514 A1 | 10/2009 | Jin |
| 2009/0260687 A1 | 10/2009 | Park |
| 2009/0266974 A1 | 10/2009 | Verhulst |
| 2009/0272423 A1 | 11/2009 | Niira |
| 2009/0278998 A1 | 11/2009 | El-Ghoroury et al. |
| 2009/0289320 A1 | 11/2009 | Cohen |
| 2009/0305454 A1 | 12/2009 | Cohen |
| 2010/0006817 A1 | 1/2010 | Ohlsson et al. |
| 2010/0019252 A1 | 1/2010 | Bratkovski et al. |
| 2010/0019296 A1 | 1/2010 | Cha |
| 2010/0019355 A1 | 1/2010 | Kamins |
| 2010/0104494 A1 | 4/2010 | Meng |
| 2010/0116976 A1 | 5/2010 | Wober |
| 2010/0132779 A1 | 6/2010 | Hong |
| 2010/0133986 A1 | 6/2010 | Kim et al. |
| 2010/0136721 A1 | 6/2010 | Song |
| 2010/0148221 A1 | 6/2010 | Yu |
| 2010/0163714 A1 | 7/2010 | Wober |
| 2010/0163941 A1 | 7/2010 | Jung |
| 2010/0187404 A1 | 7/2010 | Klem |
| 2010/0200065 A1 | 8/2010 | Choi |
| 2010/0218816 A1 | 9/2010 | Guha |
| 2010/0229939 A1 | 9/2010 | Shen |
| 2010/0230653 A1 | 9/2010 | Chen |
| 2010/0237454 A1 | 9/2010 | Fujisawa |
| 2010/0244108 A1 | 9/2010 | Kohnke et al. |
| 2010/0244169 A1 | 9/2010 | Maeda et al. |
| 2010/0249877 A1 | 9/2010 | Naughton |
| 2010/0258184 A1 | 10/2010 | Laughlin |
| 2010/0276572 A1 | 11/2010 | Iwabuchi |
| 2010/0282314 A1 | 11/2010 | Coakley |
| 2010/0295019 A1 | 11/2010 | Wang et al. |
| 2010/0304061 A1 | 12/2010 | Ye et al. |
| 2010/0308214 A1 | 12/2010 | Wober |
| 2010/0320444 A1 | 12/2010 | Dutta |
| 2011/0036396 A1 | 2/2011 | Jayaraman |
| 2011/0037133 A1 | 2/2011 | Su et al. |
| 2011/0080508 A1 | 4/2011 | Katsuno et al. |
| 2011/0133060 A1 | 6/2011 | Yu et al. |
| 2011/0133160 A1 | 6/2011 | Yu et al. |
| 2011/0135814 A1 | 6/2011 | Miyauchi et al. |
| 2011/0139176 A1 | 6/2011 | Cheung et al. |
| 2011/0147870 A1 | 6/2011 | Ang et al. |
| 2011/0180894 A1 | 7/2011 | Samuelson |
| 2011/0195577 A1 | 8/2011 | Kushibiki et al. |
| 2011/0226937 A1 | 9/2011 | Yu et al. |
| 2011/0253982 A1 | 10/2011 | Wang et al. |
| 2011/0272014 A1 | 11/2011 | Mathai et al. |
| 2011/0309237 A1 | 12/2011 | Seo et al. |
| 2011/0315988 A1 | 12/2011 | Yu et al. |
| 2011/0316106 A1 | 12/2011 | Kim |
| 2012/0009714 A1 | 1/2012 | Mouli |

FOREIGN PATENT DOCUMENTS

| | | |
|---|---|---|
| JP | 2007201091 | 8/2007 |
| WO | 8603347 | 6/1986 |
| WO | 0002379 | 1/2000 |
| WO | 2005064337 | 7/2005 |
| WO | WO2008/069565 | 6/2008 |
| WO | 2008079076 | 7/2008 |
| WO | 2008131313 | 10/2008 |
| WO | 2008/143727 A2 | 11/2008 |
| WO | 2008135905 | 11/2008 |
| WO | 2008135905 A3 | 11/2008 |
| WO | 2009116018 | 9/2009 |
| WO | 2009137241 | 11/2009 |
| WO | 2010019887 | 2/2010 |
| WO | 2010039631 | 4/2010 |

OTHER PUBLICATIONS

Rosfjord et al., Nanowire Single-Photon Detector with an Integrated Optical Cavity and Anti-Reflection Coating, Optics Express: The International Electronic Journal of Optics, Jan. 23, 2006, vol. 14, No. 2, pp. 527-534.

William Shockley and H. Queisser, Detailed Balance Limit of Efficiency of p-n Junction Solar Cells, J. of Appl. Physics, Mar. 1961 32(3).

International Preliminary Report on Patentability for PCT International Application No. PCT/US2010/035722, mailed Nov. 3, 2011.
International Search Report and Written Opinion for PCT International Patent Application No. PCT/US2011/060348, mailed Mar. 9, 2012.
International Search Report and Written Opinion for PCT International Patent Application No. PCT/US2011/064635, mailed Apr. 13, 2012.
International Search Report and Written Opinion for PCT International Patent Application No. PCT/US2011/066097, mailed Mar. 12, 2012.
International Search Report and Written Opinion for PCT International Patent Application No. PCT/US2011/067712, mailed May 3, 2012.
International Preliminary Report and Written Opinion re PCT/US2010/059491, mailed Jun. 21, 2012.
U.S. Office Action for U.S. Appl. No. 12/573,582, dated Jun. 28, 2012.
International Preliminary Report and Written Opinion re PCT/US2010/059496, mailed Jun. 21, 2012.
International Preliminary Report and Written Opinion re PCT/US2010/059504, mailed Jun. 21, 2012.
International Search Report and Written Opinion re PCT/US2011/57325, mailed Jun. 22, 2012.
International Preliminary Report and Written Opinion re PCT/US2010/059468, mailed Jun. 21, 2012.
"CMOS image sensor pixel optical efficiency and optical crosstalk optimization using FDTD Solutions" www.lumerical.com/fdtd_microlens/cmos_image_sensor_pixel_microlens.php, Mar. 19, 2009.
Furumiya, et al. "High-sensitivity and no-crosstalk pixel technology for embedded CMOS image sensor"; IEEE Electron Device Letters, vol. 48, No. 10, Oct. 2001.
International Search Report and Written Opinion for PCT International Application No. PCT/US2010/035722, mailed Jul. 20, 2010.
T. H. Hsu, et al. 'Light Guide for Pixel Crosstalk Improvement in Deep Submicron CMOS Image Sensor'; IEEE Electron Device Letters, vol. 25, No. 1, Jan. 2004.
Tseng, et al. 'Crosstalk improvement technology applicable to 0.14μm CMOS image sensor'; IEEE International Electron Devices Meeting, Dec. 13-15, 2004; IEDM Technical Digest, pp. 997-1000.vbTab.
International Search Report and Written Opinion for PCT International Patent Application No. PCT/US2009/063592, mailed Jan. 13, 2010.
CMOS image sensor pixel microlens array optimization using FDTD Solutions, http://www.lumerical_com/ fdtd_microlens/cmos_image_sensor_pixel_microlens.php, pp. 1-2, Jun. 25, 2008.
Adler, Nanowire Lawns Make for Sheets of Image Sensors, NewScientist.com, Jul. 28, 2008.
Babinec et al., High-Flux, Low-Power Diamond Nanowire Single-Photon Source Arrays: An Enabling Material for Optical and Quantum Computing and Cryptography, obtained on Jul. 22, 2010 at URL: <http://otd.harvard.edu/technologies/tech.php?case=3702>.
Baillie et al., 'Zero-space microlenses for CMOS image sensors: optical modeling and lithographic process development', Publication Date May 2004, http://adsabs.harvard.edu/abs/2004SPIE.5377..953B, pp. 1-2.vbTab.
Barclay et al., Chip-Based Microcavities Coupled to NV Centers in Single Crystal Diamond, Applied Physics Letters, Nov. 12, 2009, vol. 95, Issue 19.
Brouri et al., Photon Antibunching in the Flurescence of Individual Colored Centers in Diamond, Optics Letters, Sep. 1, 2000, vol. 25, Issue 17.
Chung, Sung-Wook et al. Silicon Nanowire Devices. Applied Physics Letters, vol. 76, No. 15 (Apr. 10, 2000), pp. 2068-2070.
Deptuch et al., Vertically Integrated Circuits at Fermilab, IEEE Transactions on Nuclear Science, Aug. 2010, vol. 54, Issue 4, pp. 2178-2186.
Ekroll, On the Nature of Simultaneous Color Contrast, Dissertation, University of Kiel, 2005.

Fan et al., Large-Scale, Heterogeneous Integration of Nanowire Arrays for Image Sensor Circuitry, Proceedings of the National Academy of Sciences (PNAS) of the United States of America, Aug. 12, 2008, vol. 105, No. 32.
Fang et al., Fabrication of Slantingly-Aligned Silicon Nanowire Arrays for Solar Cell Applications, Nanotechnology, 2008, vol. 19, No. 25.
Gadelrab et al., The Source-Gated Amorphous Silicon Photo-Transistor, IEEE Transactions on Electron Devices, Oct. 1997, vol. 44, No. 10, pp. 1789-1794.
Gambino et al., 'CMOS Imager with Copper Wiring and Lightpipe,' Electron Devices Meeting, 2006. IEDM '06, International Publication Date: Dec. 11-13, 2006, pp. 1-4.
Garnett et al., Light Trapping in Silicon Nanowire Solar Cells, Nanoletters, Jan. 28, 2010, vol. 10, No. 3, pp. 1082-1087.
Ge et al., Orientation-Controlled Growth of Single-Crystal Silicon-Nanowire Arrays, Advanced Materials, Jan. 18, 2005, vol. 17, No. 1, pp. 56-61.
Guillaumée, et al., Polarization Sensitive Silicon Photodiodes Using Nanostructured Metallic Grids, Applied Physics Letters 94, 2009.
Hanrath et al., Nucleation and Growth of Germanium Nanowires Seeded by Organic Monolayer-Coated Gold Nanocrystals, J. Am. Chem. Soc., Feb. 20, 2002, vol. 124, No. 7, pp. 1424-1429.
Hanrath et al., Supercritical Fluid-Liquid-Solid (SFLS) Synthesis of Si and Ge Nanowires Seeded by Colloidal Metal Nanocrystals, Advanced Materials, Mar. 4, 2003, vol. 15, No. 5, pp. 437-440.
Hochbaum et al., Controlled Growth of Si Nanowire Arrays for Device Integration, Nano Letters, Mar. 2005, vol. 5, No. 3, pp. 457-460.
Holmes et al., Control of Thickness and Orientation of Solution-Grown Silicon Nanowires, Science, Feb. 25, 2000, vol. 287, No. 5457, pp. 1471-1473.
International Preliminary Report on Patentability for PCT International Patent Application No. PCT/U62009/055963, mailed Mar. 17, 2011.
International Search Report and Written Opinion for PCT International Application No. PCT/US2010/035726, mailed Jul. 21, 2010.
International Search Report and Written Opinion for PCT International Application No. PCT/US2010/057227, mailed Jan. 26, 2011.
International Search Report and Written Opinion for PCT International Patent Application No. PCT/US2009/055963, mailed Oct. 15, 2009.vbTab.
International Search Report and Written Opinion for PCT International Patent Application No. PCT/US2010/051435, mailed Dec. 3, 2010.
International Search Report and Written Opinion for PCT International Patent Application No. PCT/US2010/059468, mailed Feb. 11, 2011.
International Search Report and Written Opinion for PCT International Patent Application No. PCT/US2010/059491, mailed Feb. 9, 2011.
International Search Report and Written Opinion for PCT International Patent Application No. PCT/US2010/059501, mailed Feb. 15, 2011.
International Search Report and Written Opinion for PCT International Patent Application No. PCT/US2010/059504, mailed Apr. 7, 2011.
Juan et al., High Aspect Ratio Polymide Etching Using an Oxygen Plasma Generated by Electron Cyclotron Resonance Source, Journal of Vacuum Science and Technology, Jan./Feb. 1994, vol. 12, No. 1., pp. 422-426.
Junger, et. al., Polarization- and wavelength-sensitive sub-wavelength structures fabricated in the metal layers of deep submicron CMOS processes, Proc. of SPIE, vol. 7712, 2010.
Kalkofen et al., Atomic Layer Deposition of Boron Oxide As Dopant Source for Shallow Doping of Silicon, Meeting Abstact 943, 217th ECS Meeting, MA2010-01, Apr. 25-30, 2010, Vancouver Canada, El—Advanced Gate Stack, Source / Drain, and Channel Engineering for Si-Based CMOS 6: New Materials, Processes, and Equipment.
Kane, Why Nanowires Make Great Photodetectors, EurekAlert.com article, Apr. 25, 2007.
Kempa, Thomas J. et al. Single and Tandem Axial p-i-n. Nanowire Photovoltaic Devices. Nano Letters. 2008, vol. 8, No. 10, 3456-3460.

Kim et al., Electronic Structure of Vertically Aligned Mn-Doped CoFe2O4 Nanowires and Their Application as Humidity Sensors and Photodetectors, Journal of Physical Chemistry C, Apr. 7, 2009.

Lee et al., Vertical Pillar-Superlattice Array and Graphene Hybrid Light Emitting Diodes, Nano Letters, 2010, vol. 10, pp. 2783-2788.

Lin et al., Fabrication of Nanowire Anisotropic Conductive Film for Ultra-fine Pitch Flip Chip Interconnection, Electronic Components and Technology Conference, Jun. 20, 2005, 55th Proceedings, pp. 66-70.

Lin et al., Reducing Dark Current in a High-Speed Si-Based Interdigitated Trench-Electrode MSM Photodetector, IEEE Transactions on Electron Devices, May 2003, vol. 50, No. 5, pp. 1306-1313.

Loncar et al., Diamond Nanotechnology, SPIE Newsroom, May 18, 2010, obtained at url: <http://spie.org/x40194.xml?ArticleID=x40194>.

Loose et al., CMOS Detector Technology, Scientific Detector Workshop, Sicily, 2005, Experimental Astronomy, vol. 19, Issue 1-3, pp. 111-134.

Lu et al., Growth of Single Crystal Silicon Nanowires in Supercritical Solution from Tethered Gold Particles on a Silicon Substrate, NanoLetters, Jan. 2003, vol. 3, No. 1, pp. 93-99.

Lugstein et al., Ga/Au Alloy Catalyst for Single Crystal Silicon-Nanowire Epitaxy, Applied Physics Letters, Jan. 8, 2007, vol. 90, No. 2, pp. 023109-1-023109-3.

Madou, Properties and Growth of Silicon, Including Crystalline Silicon, Fundamentals of Microfabrication, 2nd Ed., CRC Press, 2002, pp. 125-204.

Makarova et al., Fabrication of High Density, High-Aspect-Ratio Polyimide Nanofilters, Journal of Vacuum Science and Technology, Nov./Dec. 2009, vol. 27, No. 6., pp. 2585-2587.

Morales et al., A Laser Ablation Method for the Synthesis of Crystalline Semiconductor Nanowires, Science, Jan. 9, 1998, vol. 279, pp. 208-211.

Nguyen et al., Deep Reactive Ion etching of Polyimide for Microfluidic Applications, Journal of the Korean Physical Society, Sep. 2007, vol. 51, No. 3, pp. 984-988.

Pain et al., A Back-Illuminated Megapixel CMOS Image Sensor, IEEE Workshop on Charge-Coupled Devices and Advanced Image Sensors, Karuizawa, Japan, Jun. 9-11, 2005, Jet Propulsion Laboratory, National Aeronautics and Space Administration, Pasadena California.

Parraga et al., Color and Luminance Information in Natural Scenes, Journal of Optical Society of America A, Optics, Image, Science and Vision, Jun. 1998, vol. 15, No. 6.

Rugani, First All-Nanowire Sensor, Technology Review, Aug. 13, 2008, Published by MIT.

Rutter, Diamond-Based Nanowire Devices Advance Quantum Science, SEAS Communications, Feb. 14, 2010, obtained at url:<http://news.harvard.edu/gazette/story/2010/02/digging-deep-into-diamonds/>.

Sarkar et. al., Integrated polarization-analyzing CMOS image sensor for detecting incoming light ray direction, Sensors Application Symposium (SAS) p. 194-199, 1010 IEEE.

Schmidt et al., Realization of a Silicon Nanowire Vertical Surround-Gate Field-Effect Transistor, Small, Jan. 2006, vol. 2, No. 1, pp. 85-88.

Shimizu et al., Homoepitaxial Growth of Vertical Si Nanowires on Si(100) Substrate using Anodic Aluminum Oxide Template, (abstract only), Materials Research Society.

Song et al., Vertically Standing Ge Nanowires on GaAs(110) Substrates, Nanotechnology 19, Feb. 21, 2008.

Thelander et al., Nanowire-Based One-Dimensional Electronics, Materials Today, Oct. 2006, vol. 9, No. 10, pp. 28-35.

Trentler, Timothy J. et al. Solution-Liquid-Solid Growth of Cyrstalline III-V Semiconductors: An Analogy to Vapor Liquid-Solid Growth. vol. 270(5243), Dec. 15, 1995, pp. 1791-1794.

Verheijen, Marcel A. et al. Growth Kinetics of Heterostructured GaP-GaAs Nanowires. J. Am. Chem. Soc. 2006, 128, 1353-1359.

Wagner, R.S. and Ellis, W.C. Vapor-Liquid-Solid Mechanism of Single Crystal Growth. Applied Physics Letters. vol. 4, No. 5 (Mar. 1, 1964), pp. 89-90.

Wang, Introduction to Nanotechnology—Where Opportunities arise & Great Future Being Built from Small Things.

Wong et al., Lateral Nanoconcentrator Nanowire Multijunction Photovoltaic Cells, GCEP Progress report, Apr. 20, 2009, pp. 1-18.

Ye et al., Fabrication Techniques of High Aspect Ratio Vertical Lightpipes Using a Dielectric Photo Mask, SPIE, Proceedings, Feb. 2010, vol. 7591.

Zhang et al., Ultrahigh Responsivity Visible and Infrared Detection Using Silicon Nanowire Phototransistors, Nanoletters, May 14, 2010, vol. 10, No. 6, pp. 2117-2120.

International Search Report and Written Opinion for PCT International Patent Application No. PCT/US2010/051446, mailed Jan. 3, 2011.

Baomin Wang and Paul W. Leu, Nanotechology 23 (2012) 194003, 7 pages.

Sangmoo Jeon, et al., Nano Lett. 2012, 12, 2971-2976.

Sangmoo Jeong et al., J. Vac. Sci. Technol. A 30(6), Nov./Dec. 2012.

Sarkar et. al., Integrated polarization-analyzing CMOS image sensor for detecting incoming light ray direction, Sensors Application Symposium (SAS), Mar. 29, 2012, p. 194-199, 1010 IEEE.

Jin-Kon Kim; 'New Functional Nanomaterials Based on Block Copolymers' http://www.ziu.edu.cn/adver/subjectizyhd/jz0707061313.html, Jul. 7, 2011.

Ozgur Yavuzcetin, et al.; 'Index-tuned Anti-reflective Coating using a Nanostructured Metamaterial'; http://www.umass.edu/research/rld/bioportal/vuewlech.php?tid=40, Feb. 28, 2007.

Reynard Corporation; 'Anti-Reflection Coatings (AR)', http://www.reynardcorp.com/coating_anti_reflection.php, Jun. 2009.

Shimizu et al., Homoepitaxial Growth of Vertical Si Nanowires on Si(100) Substrate using Anodic Aluminum Oxide Template, (abstract only), Materials Research Society, Fall 2007.

Wang, Introduction to Nanotechnology—Where Opportunities arise & Great Future Being Built from Small Things, Fall 2008.

U.S. Final Office Action for U.S. Appl. No. 13/494,661, mailed Mar. 7, 2013, 10 pages.

U.S. Final Office Action for U.S. Appl. No. 12/966,514, mailed Mar. 19, 2013, 50 pages.

Reynard Corporation; "Anti-Reflection Coatings (AR)", http://www.reynardcorp.com/coating_anti_reflection.php, Jun. 4, 2009.

Ozgur Yavuzcetin, et al.; "Index-tuned Anti-reflective Coating using a Nanostructured Metamaterial"; http://www.umass.edu/research/rld/bioportal/vuewtech.php?tid=40, Jun. 4, 2009.

Jin-Kon Kim; "New Functional Nanomaterials Based on Block Copolymers" http://www.zju.edu.cn/adver/subject/jzyhd/jz0707061313.html, Jun. 4, 2009.

N. L. Dmitruk, et al.; "Modeling and Measurement of Optical Response of 1D Array of Metallic Nanowires for Sensing and Detection Application"; 26th International Conference on Microelectronics (MIEL 2008), Nis, Serbia, May 11-14, 2008.

Kristine M. Rosfjord, et al.; "Nanowire Single-photon detector with an integrated optical cavity and anti-reflection coating"; Optics Express; vol. 14, No. 2; Jan. 23, 2006.

Matt Law, et al.; "Semiconductor Nanowires and Nanotubes"; Annu. Rev. Mater. Res. 2004, 34:83-122.

U.S. Office Action for U.S. Appl. No. 13/494,661, notification date Nov. 7, 2012.

* cited by examiner

FIG. 1   *Prior Art*

Anti-reflection layer

ARRAY OF NANOWIRES IN A SINGLE CAVITY WITH ANTI-REFLECTIVE COATING ON SUBSTRATE

RELATED APPLICATIONS

This application is related to U.S. application Ser. No. 12/270,233, filed Nov. 13, 2008, entitled "VERTICAL WAVEGUIDES WITH VARIOUS FUNCTIONALITY ON INTEGRATED CIRCUITS," which is incorporated herein in its entirety by reference.

FIELD OF INVENTION

The embodiments relate to an integrated circuit manufacture, more particularly, light detecting devices such as a photodiode (PD) comprising of a nanowire.

BACKGROUND

An image sensor has a large number of identical sensor elements (pixels), generally greater than 1 million, in a Cartesian (square) grid. The distance between adjacent pixels is called the pitch (p). The area of a pixel is $p^2$. The area of the photosensitive element, i.e., the area of the pixel that is sensitive to light for conversion to an electrical signal, is normally only about 20% to 30% of the surface area of the pixel.

Conventional color image sensors are fabricated with colored filters arranged in a Bayer configuration. An example of a convention Bayer filter pattern has a color scheme including red, green, and blue filters (RGB). The Bayer filter pattern is 50% green, 25% red and 25% blue, hence is also referred to GRGB or other permutation such as RGGB. Twice as many green elements as red or blue are used to mimic the human eye's greater resolving power with green light. Since each pixel is filtered to record only one of three colors, the data from each pixel cannot fully determine color on its own. To obtain a full-color image, various demosaicing algorithms can be used to interpolate a set of complete red, green, and blue values for each point in the sensed scene.

The challenge of a designer is to channel as much of the light impinging on the pixel to the photosensitive element of the pixel. There are a number of factors that diminish the amount of light from reaching the photosensitive element. One factor is the manner in which the image sensor is constructed.

The layers of a typical sensor are listed in Table I and shown in FIG. 1.

TABLE I

| Typical Layer | Description | Thickness (μm) |
| --- | --- | --- |
| 15 | OVERCOAT | 2.00 |
| 14 | MICRO LENS | 0.773 |
| 13 | SPACER | 1.40 |
| 12 | COLOR FILTER | 1.20 |
| 11 | PLANARIZATION | 1.40 |
| 10 | PASS3 | 0.600 |
| 9 | PASS2 | 0.150 |
| 8 | PASS1 | 1.00 |
| 7 | IMD5B | 0.350 |
| 6 | METAL3 | 31.18 |
| 5 | IMD2B | 0.200 |
| 4 | METAL2 | 21.18 |
| 3 | IMD1B | 0.200 |
| 2 | METAL1 | 1.18 |
| 1 | ILD | 0.750 |

In Table I, typically the first layer on a silicon substrate is the ILD layer and the topmost layer is the overcoat. In Table I, ILD refers to a inter-level dielectric layer, METAL1, METAL2 and METAL3 refer to different metal layers, IMD1B, IMD2B and IMD5B refer to different inter-metal dielectric layers which are spacer layers, PASS1, PASS2 and PASS3 refer to different passivation layers (typically dielectric layers).

The total thickness of the layers above the silicon substrate of the image sensor is the stack height (s) of the image sensor and is the sum of the thickness of the individual layers. In the example of Table I, the sum of the thickness of the individual layers is about 11.6 micrometers (μm).

The space above the photosensitive element of a pixel must be transparent to light to allow incident light from a full color scene to impinge on the photosensitive element located in the silicon substrate. Consequently, no metal layers are routed across the photosensitive element of a pixel, leaving the layers directly above the photosensitive element clear.

The pixel pitch to stack height ratio (p/s) determines the cone of light (F number) that can be accepted by the pixel and conveyed to the photosensitive element on the silicon. As pixels become smaller and the stack height increases, this number decreases, thereby lowering the efficiency of the pixel.

More importantly, the increased stack height with greater number of metal layers obscure the light from being transmitted through the stack to reach the photosensitive element, in particular of the rays that impinge the sensor element at an angle. One solution is to decrease the stack height by a significant amount (i.e., >2 μm). However, this solution is difficult to achieve in a standard planar process.

Another issue, which possibly is the one that most limits the performance of the conventional image sensors, is that less than about one-third of the light impinging on the image sensor is transmitted to the photosensitive element such as a photodiode. In the conventional image sensors, in order to distinguish the three components of light so that the colors from a full color scene can be reproduced, two of the components of light are filtered out for each pixel using a filter. For example, the red pixel has a filter that absorbs green and blue light, only allowing red light to pass to the sensor.

Yet another issue is that the efficiency of the image sensor decreases dramatically with increasing departure of the angle of incident light from normal incidence. In order for the incident onto the image sensor to be detected, it must reach the sensing element of the image sensor. Light that strikes the image sensor at an angle of incidence away from the normal to the image sensor, some of the light fails to reach the sensing element, resulting in a decrease in the efficiency of the image sensor.

The development of nanoscale technology and in particular the ability to produce nanowires has opened up possibilities of designing structures and combining materials in ways not possible in planar technology. There is a need to minimize the dependence of the efficiency of an image sensor as a function of the angle of incidence of the incident light.

DETAILED DESCRIPTION

Figure 1:
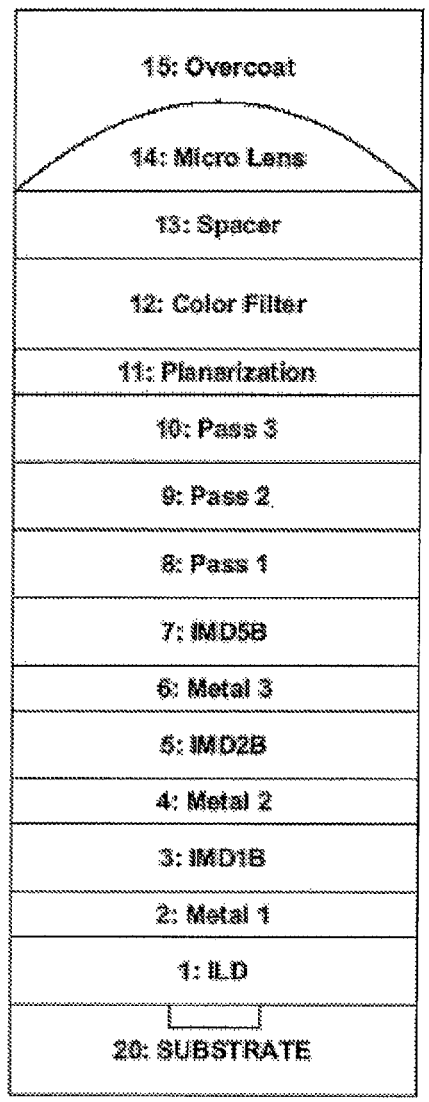
FIG. 1 shows a cross sectional view of a conventional image sensor.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

The term nanowire refers to a structure that has a thickness or diameter of the order of nanometers, for example, 100 nanometers or less and an unconstrained length. Nanowires could include metallic (e.g., Ni, Pt, Au), semiconducting (e.g., Si, InP, GaN, etc.), and insulating (e.g., $SiO_2$, $TiO_2$) materials. Molecular nanowires are composed of repeating molecular units either organic or inorganic. Nanowires could exhibit aspect ratios (length-to-width ratio) of 1000 or more. As such they could be referred to as 1-dimensional materials. Nanowires could have many interesting properties that are not seen in bulk or 3-D materials. This is because electrons in nanowires could be quantum confined laterally and thus occupy energy levels that could be different from the traditional continuum of energy levels or bands found in bulk materials. As a result, nanowires could have discrete values of electrical and optical conductance. Examples of nanowires include inorganic molecular nanowires ($Mo_6S_{9-x}I_x$, $Li_2Mo_6Se_6$), which could have a diameter of 0.9 nm, and can be hundreds of micrometers long. Other important examples are based on semiconductors such as InP, Si, GaN, etc., dielectrics (e.g. $SiO_2$, $TiO_2$), or metals (e.g. Ni, Pt).

The term excitons refer to electron hole pairs.

An active element is any type of circuit component with the ability to electrically control electron and/or hole flow (electricity controlling electricity or light, or vice versa). Components incapable of controlling current by means of another electrical signal are called passive elements. Resistors, capacitors, inductors, transformers, and even diodes are all considered passive elements. Active elements include in embodiments disclosed herein, but are not limited to, an active waveguide, transistors, silicon-controlled rectifiers (SCRs), light emitting diodes, and photodiodes. A waveguide is a system or material designed to confine and direct electromagnetic radiation of selective wavelengths in a direction determined by its physical boundaries. Preferably, the selective wavelength is a function of the diameter of the waveguide. An active waveguide is a waveguide that has the ability to electrically control electron and/or hole flow (electricity controlling electricity or light, or vice versa). This ability of the active waveguide, for example, is one reason why the active waveguide could be considered to be "active" and within the genus of an active element.

An optical pipe is an element to confine and transmit an electromagnetic radiation that impinges on the optical pipe. The optical pipe can include a core and a cladding. The core could be a nanowire. The optical pipe could be configured to separate wavelengths of an electromagnetic radiation beam incident on the optical pipe at a selective wavelength through the core and the cladding, wherein the core is configured to be both a channel to transmit the wavelengths up to the selective wavelength and an active element to detect the wavelengths up to the selective wavelength transmitted through the core. A core and a cladding are generally complimentary components of the optical pipe and are configured to separate wavelengths of an electromagnetic radiation beam incident on the optical pipe at a selective wavelength through the core and cladding.

An embodiment relates to an image sensor comprising one or more nanowires on a substrate of a cavity, the nanowire being configured to transmit a first portion of an electromagnetic radiation beam incident on the sensor, and the substrate comprising an anti-reflective material that absorbs a second portion of the electromagnetic radiation beam incident on the sensor, wherein the first portion is substantially different from the second portion, wherein the anti-reflective material absorbs at least 68 percent of optical light incident on the anti-reflective material, and wherein the anti-reflective material does not disrupt an electronic surface properties of epitaxial silicon to cause surface current leakage or provide sites for recombination of carriers generated by photons when the anti-reflective material is contacted with epitaxial silicon.

Preferably, the second portion comprises at least a portion of electromagnetic radiation that comes out from the nanowire.

Preferably, the anti-reflective material is in an anti-reflective layer on a front side of the substrate that is exposed to the electromagnetic radiation beam incident on the sensor.

Preferably, the sensor comprises a plurality of nanowires in each of the cavity.

Preferably, the nanowire is configured to separate wavelengths of the electromagnetic radiation beam incident on the nanowire at a selective wavelength.

Preferably, the first portion comprises electromagnetic radiation of wavelengths of light of a certain color and the second portion comprises electromagnetic radiation of wavelengths of light of a complementary color.

Preferably, the sensor is configured to have an array optical response that substantially resembles a human eye optical response.

Preferably, the sensor comprises a plurality of nanowires and is configured to have a substantially minor change in an array optical response with a 10° change in a direction of the electromagnetic radiation beam incident on the sensor.

Preferably, the anti-reflective layer comprises a plurality of anti-reflective films configured to absorb electromagnetic radiation of a plurality of wavelengths.

Preferably, each of the nanowires is configured to separate wavelengths of the electromagnetic radiation beam incident on the nanowire through at a selective wavelength, the sensor further comprising a pair of photosensitive elements comprising a central photosensitive element and a peripheral photosensitive element, wherein the central photosensitive element is operably coupled to the nanowire and the peripheral photosensitive element is operably coupled to the substrate around the nanowire.

Preferably, the nanowire is configured to be an active element to detect wavelengths of electromagnetic radiation transmitted through the nanowire.

Preferably, the active element is configured to be a photodiode, a charge storage capacitor, or combinations thereof.

Preferably, the anti-reflective material absorbs at least about 90 percent of optical light incident on the anti-reflective material.

Preferably, the anti-reflective material reduces a surface leakage current.

Preferably, the plurality of nanowires are located so as to create a regular or semi-regular tessellation wherein a shape is repeated over a plane without any gaps or overlaps. A regular tessellation means a tessellation made up of congruent regular polygons. Regular means that the sides of the polygon are all the same length. Congruent means that the polygons are all the same size and shape. A regular polygon has 3 or 4 or 5 or more sides and angles, all equal. A semi-regular tessellation has two properties: (1) it is formed by regular polygons; and (2) the arrangement of polygons at every vertex point is identical.

Preferably, the tessellation is a regular tessellation such as a triangular tessellation, a square tessellation, a hexagonal tessellation or combinations thereof.

Another embodiment relates to a device comprising the sensor having a plurality of nanowires in each of the cavity, with each of the nanowires configured to separate wavelengths of the electromagnetic radiation beam incident on the nanowire through at a selective wavelength, the sensor further comprising a pair of photosensitive elements comprising a central photosensitive element and a peripheral photosensitive element, wherein the central photosensitive element is operably coupled to the nanowire and the peripheral photosensitive element is operably coupled to the substrate around the nanowire. The device could be an image sensor.

Preferably, the nanowire comprises a waveguide.

The device could further comprise a passivation layer around the waveguide.

The device could further comprise a metal layer around the waveguide.

Preferably, the device comprises no color or IR filter.

Preferably, the nanowire has a nanowire index of refraction ($n_1$), and a cladding surrounding the nanowire has a cladding index of refraction ($n_2$), wherein $n_1 > n_2$, $n_1 = n_2$, or $n_1 < n_2$.

Preferably, the selective wavelength is a function of the diameter of the waveguide.

The device could further comprise at least a pair of metal contacts with at least one of the metal contacts being contacted to the waveguide.

Another embodiment relates to a device comprising the sensor having the nanowire configured to be an active element to detect wavelengths of electromagnetic radiation transmitted through the nanowire. The device could be an image sensor.

Preferably, the waveguide is configured to convert energy of the electromagnetic radiation transmitted through the waveguide and to generate excitons.

Preferably, the waveguide comprises a PIN junction that is configured to detect the excitons generated in the waveguide.

The device could further comprise an insulator layer around the waveguide and a metal layer around the insulator layer to form a capacitor that is configured to collect the excitons generated in the waveguide and store charge in the capacitor.

The device could further comprise metal contacts that connect to the metal layer and waveguide to control and detect the charge stored in the capacitor.

The device could further comprise a cladding around the nanowire, and the substrate comprises a peripheral photosensitive element, wherein the peripheral photosensitive element is operably coupled to the cladding.

Preferably, the substrate comprises an electronic circuit.

The device could further comprise a lens structure or an optical coupler over the nanowire, wherein the lens structure or the optical coupler is operably coupled to the nanowire.

The device could further comprise a stack surrounding the nanowire, the stack comprising metallic layers embedded in dielectric layers.

Preferably, a surface of the stack comprises a reflective surface.

Preferably, the anti-reflective material is not located on the nanowire or on a back-side of the substrate opposite to a front side of the substrate that is exposed to the electromagnetic radiation beam incident on the sensor.

Preferably, a wall surface of the cavity has a reflective surface.

Preferably, a wall surface of the nanowire has a reflective surface.

Preferably, a wall surface of the of the nanowire has reflective surface.

Another embodiment relates to an image sensor comprising a plurality of nanowires on a substrate of a cavity, the nanowire being configured to transmit a first portion of an electromagnetic radiation beam incident on the sensor, the substrate absorbs a second portion of the electromagnetic radiation beam incident on the sensor, wherein the first portion is substantially different from the second portion.

Yet another embodiment relates to an image sensor comprising a nanowire on a substrate of a cavity, the nanowire being configured to transmit a first portion of an electromagnetic radiation beam incident on the sensor, the substrate absorbs a second portion of the electromagnetic radiation beam incident on the sensor, wherein the first portion is substantially different from the second portion, and the ratio of a diameter of the cavity to a diameter of the nanowire is at less than about 10.

In yet other embodiments, a plurality of nanowires are arranged on a regular tessellation.

Figure 2:
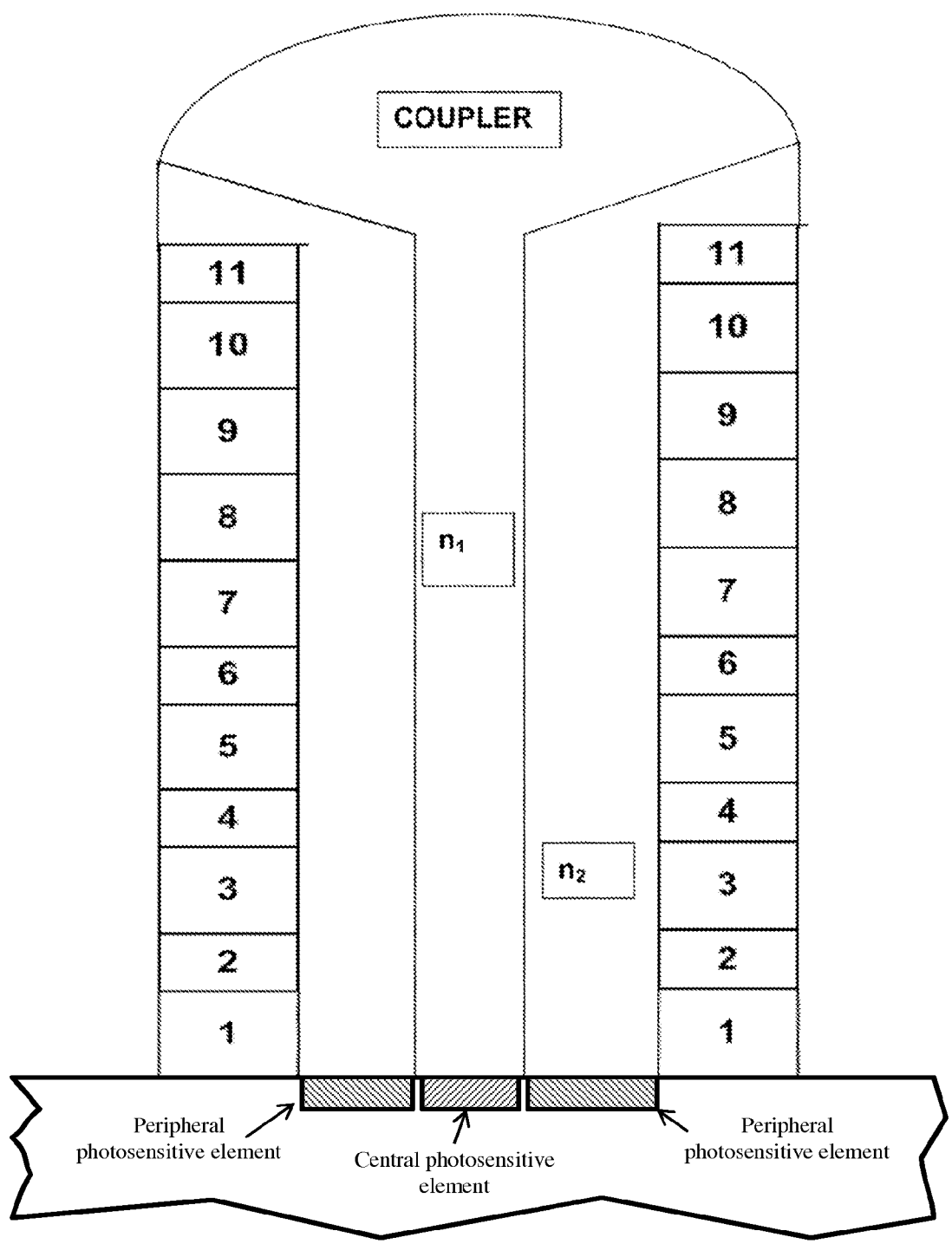
FIG. 2 shows a cross sectional view of an embodiment of an image sensor having a microlens.

In yet other embodiments, as shown in FIG. 2, a coupler that may take the shape of a micro lens efficiently could be located on the optical pipe to collect and guide the electromagnetic radiation into the optical pipe. As shown in FIG. 2, the optical pipe comprises of a nanowire core of refractive index $n_1$ surrounded by a cladding of refractive index $n_2$.

In the configuration of the optical pipe of FIG. 2, it is possible to eliminate pigmented color filters that absorb about ⅔ of the light that impinges on the image sensor. The core functions as an active waveguide and the cladding of the optical pipe could function as a passive waveguide with a peripheral photosensitive element surrounding the core to detect the electromagnetic radiation transmitted through the passive waveguide of the cladding. Passive waveguides do not absorb light like color filters, but can be designed to selectively transmit selected wavelengths.

A waveguide, whether passive or active, has a cutoff wavelength that is the lowest frequency that the waveguide can propagate. The diameter of the semiconductor nanowire of the core serves as the control parameter for the cutoff wavelength of the nanowire.

The nanowire could also serve as a photodiode by absorbing the confined light and generating electron hole pairs (excitons).

Excitons so generated can be detected by using at least one of the following two designs:

(1) A core is made up of a three layers, semiconductor, insulator and metal thus forming a capacitor to collect the charge generated by the light induced carriers. Contacts are made to the metal and to the semiconductor to control and detect the stored charge. The core could be formed by growing a nanowire and depositing an insulator layer and a metal layer surrounding the nanowire.

(2) A core having a PIN junction that induces a potential gradient in the core wire. The PIN junction in the core could be formed by growing a nanowire and doping the nanowire core while it is growing as a PIN junction and contacting it at the appropriate points using the various metal layers that are part of any device.

The photosensitive elements of the embodiments typically comprise a photodiode, although not limited to only a photodiode. Typically, the photodiode is doped to a concentration from about $1 \times 10^{16}$ to about $1 \times 10^{18}$ dopant atoms per cubic centimeter, while using an appropriate dopant.

The layers 1-11 in FIG. 2 illustrate different stacking layers similar to layers 1-11 of FIG. 1. The stacking layers comprise dielectric material-containing and metal-containing layers. The dielectric materials include as but not limited to oxides, nitrides and oxynitrides of silicon having a dielectric constant from about 4 to about 20, measured in vacuum. Also included, and also not limiting, are generally higher dielectric constant gate dielectric materials having a dielectric constant from about 20 to at least about 100. These higher dielectric constant dielectric materials may include, but are not limited to hafnium oxides, hafnium silicates, titanium oxides, barium-strontium titanates (BSTs) and lead-zirconate titanates (PZTs).

The dielectric material-containing layers may be formed using methods appropriate to their materials of composition. Non-limiting examples of methods include thermal or plasma oxidation or nitridation methods, chemical vapor deposition methods (including atomic layer chemical vapor deposition methods) and physical vapor deposition methods.

The metal-containing layers could function as electrodes. Non-limiting examples include certain metals, metal alloys, metal silicides and metal nitrides, as well as doped polysilicon materials (i.e., having a dopant concentration from about $1 \times 10^{18}$ to about $1 \times 10^{22}$ dopant atoms per cubic centimeter) and polycide (i.e., doped polysilicon/metal silicide stack) materials. The metal-containing layers may be deposited using any of several methods. Non-limiting examples include chemical vapor deposition methods (also including atomic layer chemical vapor deposition methods) and physical vapor deposition methods. The metal-containing layers could comprise a doped polysilicon material (having a thickness typically in the range 1000 to 1500 Angstrom The dielectric and metallization stack layer comprises a series of dielectric passivation layers. Also embedded within the stack layer are interconnected metallization layers. Components for the pair of interconnected metallization layers include, but are not limited to contact studs, interconnection layers, interconnection studs.

The individual metallization interconnection studs and metallization interconnection layers that could be used within the interconnected metallization layers may comprise any of several metallization materials that are conventional in the semiconductor fabrication art. Non-limiting examples include certain metals, metal alloys, metal nitrides and metal silicides. Most common are aluminum metallization materials and copper metallization materials, either of which often includes a barrier metallization material, as discussed in greater detail below. Types of metallization materials may differ as a function of size and location within a semiconductor structure. Smaller and lower-lying metallization features typically comprise copper containing conductor materials. Larger and upper-lying metallization features typically comprise aluminum containing conductor materials.

The series of dielectric passivation layers may also comprise any of several dielectric materials that are conventional in the semiconductor fabrication art. Included are generally higher dielectric constant dielectric materials having a dielectric constant from 4 to about 20. Non-limiting examples that are included within this group are oxides, nitrides and oxynitrides of silicon. For example, the series of dielectric layers may also comprise generally lower dielectric constant dielectric materials having a dielectric constant from about 2 to about 4. Included but not limiting within this group are hydrogels such as silicon hydrogel, aerogels like silicon Al, or carbon aerogel, silsesquioxane spin-on-glass dielectric materials, fluorinated glass materials, organic polymer materials, and other low dielectric constant materials such as doped silicon dioxide (e.g., doped with carbon, fluorine), and porous silicon dioxide.

Typically, the dielectric and metallization stack layer comprises interconnected metallization layers and discrete metallization layers comprising at least one of copper metallization materials and aluminum metallization materials. The dielectric and metallization stack layer also comprises dielectric passivation layers that also comprise at least one of the generally lower dielectric constant dielectric materials disclosed above. The dielectric and metallization stack layer could have an overall thickness from about 1 to about 4 microns. It may comprise from about 2 to about 4 discrete horizontal dielectric and metallization component layers within a stack.

The layers of the stack layer could be patterned to form patterned dielectric and metallization stack layer using methods and materials that are conventional in the semiconductor fabrication art, and appropriate to the materials from which are formed the series of dielectric passivation layers. The dielectric and metallization stack layer may not be patterned at a location that includes a metallization feature located completely therein. The dielectric and metallization stack layer may be patterned using wet chemical etch methods, dry plasma etch methods or aggregate methods thereof. Dry plasma etch methods as well as e-beam etching if the dimension needs to be very small, are generally preferred insofar as they provide enhanced sidewall profile control when forming the series of patterned dielectric and metallization stack layer.

The planarizing layer 11 may comprise any of several optically transparent planarizing materials. Non-limiting examples include spin-on-glass planarizing materials and organic polymer planarizing materials. The planarizing layer 11 could extend above the optical pipe such that the planarizing layer 11 would have a thickness sufficient to at least planarize the opening of the optical pipe, thus providing a planar surface for fabrication of additional structures within the CMOS image sensor. The planarizing layer could be patterned to form the patterned planarizing layer.

Optionally, there could be a series of color filter layers 12 located upon the patterned planarizing layer 11. The series of color filter layers, if present, would typically include either the primary colors of red, green and blue, or the complementary colors of yellow, cyan and magenta. The series of color filter layers would typically comprise a series of dyed or pigmented patterned photoresist layers that are intrinsically imaged to form the series of color filter layers. Alternatively, the series of color filter layers may comprise dyed or pigmented organic polymer materials that are otherwise optically transparent, but extrinsically imaged while using an appropriate mask layer. Alternative color filter materials may also be used. The filter could also be filter for a black and white, or IR sensors wherein the filter cuts off visible and pass IR predominantly.

The spacer layer (13) could be one or more layers made of any material that physically, but not optically, separates the stacking layers from the micro lens (14). The spacer layer could be formed of a dielectric spacer material or a laminate of dielectric spacer materials, although spacer layers formed of conductor materials are also known. Oxides, nitrides and oxynitrides of silicon are commonly used as dielectric spacer materials. Oxides, nitrides and oxynitrides of other elements are not excluded. The dielectric spacer materials may be deposited using methods analogous, equivalent or identical to the methods described above. The spacer layer could be formed using a blanket layer deposition and etchback method that provides the spacer layer with the characteristic inward pointed shape.

The micro lens (14) may comprise any of several optically transparent lens materials that are known in the art. Non-limiting examples include optically transparent inorganic materials, optically transparent organic materials and optically transparent composite materials. Most common are optically transparent organic materials. Typically the lens layers could be formed incident to patterning and reflow of an organic polymer material that has a glass transition temperature lower than the series of color filter layers 12, if present, or the patterned planarizing layer 11.

In the optical pipe of FIG. 2, the high index material in the core could, for example, be silicon nitride having a refractive index of about 2.0. The lower index cladding layer material could, for example, be a glass, for example a material selected from Table II, having a refractive index about 1.5.

TABLE II

| Typical Material | Index of Refraction |
|---|---|
| Micro Lens (Polymer) | 1.583 |
| Spacer | 1.512 |
| Color Filter | 1.541 |
| Planarization | 1.512 |
| PESiN | 2.00 |
| PESiO | 1.46 |
| SiO | 1.46 |

In Table II, PESiN refers to plasma enhanced SiN and PESiO refers to plasma enhanced SiO.

Optionally, a micro lens could be located on the optical pipe near the incident electromagnetic radiation beam receiving end of the image sensor. The function of the micro lens or in more general terms is to be a coupler, i.e., to couple the incident electromagnetic radiation beam into the optical pipe. If one were to choose a micro lens as the coupler in this embodiment, its distance from the optical pipe would be much shorter than to the photosensitive element, so the constraints on its curvature are much less stringent, thereby making it implementable with existing fabrication technology.

The shape of the optical pipe could be different for different embodiments. In one configuration, the optical pipe could cylindrical, that is, the diameter of the pipe remains the substantially the same throughout the length of the optical pipe. In another configuration, the optical pipe could conical, where the upper diameter of the cross sectional area of the optical pipe could be greater or smaller than the lower diameter of the cross sectional area of the optical pipe. The terms "upper" and "lower" refer to the ends of the optical pipe located closer to the incident electromagnetic radiation beam receiving and exiting ends of the image sensor. Other shapes include a stack of conical sections.

Table II lists several different glasses and their refractive indices. These glasses could be used for the manufacture of the optical pipe such that refractive index of the core is higher than that of the cladding. The image sensors of the embodiments could be fabricated using different transparent glasses having different refractive indices without the use of pigmented color filters.

By nesting optical pipes that function as waveguides and using a micro lens coupler as shown in FIG. 2, an array of image sensors could be configured to obtain complementary colors having wavelengths of electromagnetic radiation separated at a cutoff wavelength in the core and cladding of each optical pipe of every image sensor. The complementary colors are generally two colors when mixed in the proper proportion produce a neutral color (grey, white, or black). This configuration also enables the capture and guiding of most of the electromagnetic radiation incident beam impinging on the micro lens to the photosensitive elements (i.e., photodiodes) located at the lower end of the optical pipe. Two adjacent or substantially adjacent image sensors with different color complementary separation can provide complete information to reconstruct a full color scene according to embodiments described herein. This technology of embodiments disclosed herein can further supplant pigment based color reconstruction for image sensing which suffers from the inefficiency of discarding (through absorption) the non selected color for each pixel.

Each physical pixel of a device containing an image sensor of the embodiments disclosed herein would have two outputs representing the complementary colors, e.g., cyan (or red) designated as output type 1 and yellow (or blue) designated as output type 2. These outputs would be arranged as follows:

1 2 1 2 1 2 1 2 1 2 1 2 1 2 1 2...

2 1 2 1 2 1 2 1 2 1 2 1 2 1 2 1...

1 2 1 2 1 2 1 2 1 2 1 2 1 2 1 2...

. . . . . . . . . . . . . . . .

. . . . . . . . . . . . . . . .

Each physical pixel would have complete luminance information obtained by combining its two complementary outputs. As a result, the same image sensor can be used either as a full resolution black and white or full color sensor.

In the embodiments of the image sensors disclosed herein, the full spectrum of wavelengths of the incident electromagnetic radiation beam (e.g., the full color information of the incident light) could be obtained by the appropriate combination of two adjacent pixels either horizontally or vertically as opposed to 4 pixels for the conventional Bayer pattern.

Depending on minimum transistor sizes, each pixel containing an image sensor of the embodiments disclosed herein could be as small as 1 micron or less in pitch and yet have sufficient sensitivity. This could open the way for contact imaging of very small structures such as biological systems.

The embodiments, which include a plurality of embodiments of an image sensor, as well as methods for fabrication thereof, will be described in further detail within the context of the following description. The description is further understood within the context of the drawings described above. The drawings are for illustrative purposes and as such are not necessarily drawn to scale.

An embodiment of a compound pixel comprises a system of two pixels, each having a core of a different diameter such that cores have diameters $d_1$ and $d_2$ for directing light of different wavelengths ($\lambda_B$ and $\lambda_R$). The two cores also serve as photodiodes to capture light of wavelengths $\lambda_B$ and $\lambda_R$. The claddings of the two image sensors serve for transmitting the light of wave length $\lambda_{w-B}$ and $\lambda_{w-R}$. The light of wave length $\lambda_{w-B}$ and $\lambda_{w-R}$ transmitted through the cladding is detected by the peripheral photosensitive elements surrounding the cores. Note that (w) refers to the wavelength of white light. Signals from the 4 photodiodes (two located in the cores and two located in or on the substrate surrounding the core) in the compound pixel are used to construct color.

The embodiments include a nanostructured photodiode (PD) according to the embodiments comprise a substrate and an upstanding nanowire protruding from the substrate. A pn-junction giving an active region to detect light may be present within the structure. The nanowire, a part of the nanowire, or a structure in connection with the nanowire, forms a waveguide directing and detecting at least a portion of the light that impinges on the device. In addition the waveguide doubles up as spectral filter that enables the determination of the color range of the impinging light.

A nanostructured PD according to the embodiments comprises of an upstanding nanowire. For the purpose of this application an upstanding nanowire should be interpreted as a nanowire protruding from the substrate in some angle, the upstanding nanowire for example being grown from the substrate, preferably by as vapor-liquid-solid (VLS) grown nanowires. The angle with the substrate will typically be a result of the materials in the substrate and the nanowire, the surface of the substrate and growth conditions. By controlling these parameters it is possible to produce nanowires pointing in only one direction, for example vertical, or in a limited set of directions. For example nanowires and substrates of zinc-blend and diamond semiconductors composed of elements from columns III, V and IV of the periodic table, such nanowires can be grown in the [111] directions and then be grown in the normal direction to any {111} substrate surface. Other directions given as the angle between normal to the surface and the axial direction of the nanowire include 70.53° {111}, 54.73° {100}, and 35.27° and 90°, both to {110}. Thus the nanowires define one, or a limited set, of directions.

According to the embodiments, a part of the nanowire or structure formed from the nanowire is used as a waveguide directing and confining at least a portion of the light impinging on the nanostructured PD in a direction given by the upstanding nanowire. The waveguiding nanostructured PD structure could include a high refractive index core with one or more surrounding cladding with refractive indices less than that of the core. The structure is either circular symmetrical or close to being circular symmetrical. Light waveguiding in circular symmetrical structures are well know for fiber-optic applications and many parallels can be made to the area of rare-earth-doped fiber optic devices. However, one difference is that fiber amplifier are optically pumped to enhance the light guided through them while the described nanostructured PD can be seen as an efficient light to electricity converter. One well known figure of merit is the so called Numerical Aperture, NA. The NA determines the angle of light captured by the waveguide. The NA and angle of captured light is an important parameter in the optimization of a new PD structure.

For a PD operating in IR and above IR, using GaAs is good, but for a PD operating in the visible light region, silicon would be preferable. For example to create circuits, Si and doped Si materials are preferable. Similarly, for a PD working in the visible range of light, one would prefer to use Si.

In one embodiment, the typical values of the refractive indexes for III-V semiconductor core material are in the range from 2.5 to 5.5 when combined with glass type of cladding material (such as $SiO_2$ or $Si_3N_4$) having refractive indexes ranging from 1.4 to 2.3. A larger angle of capture means light impinging at larger angles can be coupled into the waveguide for better capture efficiency.

One consideration in the optimization of light capture is to provide a coupler into the nanowire structure to optimize light capture into the structure. In general, it would be preferred to have the NA be highest where the light collection takes place. This would maximize the light captured and guided into the PD.

A nanostructured PD according to the embodiments could comprise a substrate and a nanowire epitaxially grown from the substrate in an defined angle θ. A portion of or all of the nanowire could be arranged to act as a waveguiding portion directing at least a portion of the impinging light in a direction given by the elongated direction of the nanowire, and will be referred to as a waveguide. In one possible implementation, a pn-junction necessary for the diode functionality is formed by varying the doping of the wire along its length while it is growing. Two contact could be provided on the nanowire for example one on top or in a wrapping configuration on the circumferential outer surface and the other contact could be provided in the substrate. The substrate and part of the upstanding structure may be covered by a cover layer, for example as a thin film as illustrated or as material filling the space surrounding the nanostructured PD.

The nanowire could have a diameter in the order of 50 nm to 500 nm, The length of the nanowire could be of the order of 1 to 10 μm. The pn-junction results in an active region arranged in the nanowire. Impinging photons in the nanowire are converted to electron hole pairs and in one implementation are subsequently separated by the electric fields generated by the PN junction along the length of the nanowire. The materials of the different members of the nanostructured PD are chosen so that the nanowire will have good waveguiding properties vis-à-vis the surrounding materials, i.e. the refractive index of the material in the nanowire should preferably be larger than the refractive indices of the surrounding materials.

In addition, the nanowire may be provided with one or more layers. A first layer, may be introduced to improve the surface properties (i.e., reduce charge leakage) of the nanowire. Further layers, for example an optical layer may be introduced specifically to improve the waveguiding properties of the nanowire, in manners similar to what is well established in the area of fiber optics. The optical layer typically has a refractive index in between the refractive index of the nanowire and the surrounding cladding region material. Alternatively the intermediate layer has a graded refractive index, which has been shown to improve light transmission in certain cases. If an optical layer is utilized the refractive index of the nanowire, $n_w$, should define an effective refractive index for both the nanowire and the layers.

The ability to grow nanowires with well defined diameters, as described above and exemplified below, could be to optimize the waveguiding properties of the nanowire or at least the waveguide with regards to the wavelength of the light confined and converted by the nanostructured PD. The diameter of the nanowire is chosen so as to have a favorable correspondence to the wavelength of the desired light. Preferably the dimensions of the nanowire are such that a uniform optical cavity, optimized for the specific wavelength of the produced light, is provided along the nanowire. The core nanowire must be sufficiently wide to capture the desired light. A rule of thumb would be that diameter must be larger than $\lambda/2n_w$, wherein $\lambda$ is the wavelength of the desired light and $n_w$ is the refractive index of the nanowire. As an example a diameter of about 60 nm may be appropriate to confine blue light only and one 80 nm may be appropriate for to confine both blue and green light only in a silicon nanowire.

In the infra-red and near infra-red a diameter above 100 nm would be sufficient. An approximate preferred upper limit for the diameter of the nanowire is given by the growth constrains, and is in the order of 500 nm. The length of the nanowire is typically and preferably in the order of 1-10 μm, providing enough volume for the light conversion region A reflective layer is in one embodiment, provided on the substrate and extending under the wire. The purpose of the reflective layer is to reflect light that is guided by the wire but has not been absorbed and converted to carriers in the nanostructured PD. The reflective layer is preferably provided in the form of a multilayered structure comprising repeated layers of silicates for example, or as a metal film. If the diameter of the nanowire is sufficiently smaller than the wavelength of the light a large fraction of the directed light mode will extend outside the waveguide, enabling efficient reflection by a reflective layer surrounding the narrow the nanowire waveguide An alternative approach to getting a reflection in the lower end of the waveguide core is to arrange a reflective layer in the substrate underneath the nanowire. Yet another alternative is to introduce reflective means within the waveguide. Such reflective means can be a multilayered structure provided during the growth process of the nanowire, the multilayered structure comprising repeated layers of for example $SiN_x$/$SiO_x$ (dielectric).

To form the pn-junction necessary for light detection at least part of the nanostructure is preferably doped. This is done by either changing dopants during the growth of the nanowire or using a radial shallow implant method on the nanowire once it is grown.

Considering systems where nanowire growth is locally enhanced by a substance, as vapor-liquid-solid (VLS) grown nanowires, the ability to alter between radial and axial growth by altering growth conditions enables the procedure (nanowire growth, mask formation, and subsequent selective growth) can be repeated to form nanowire/3D-sequences of higher order. For systems where nanowire growth and selective growth are not distinguished by separate growth conditions it may be better to first grow the nanowire along the length and by different selective growth steps grow different types of 3D regions.

A fabrication method according to the present embodiments in order to fabricate a light detecting pn-diode/array with active nanowire region(s) formed of Si, comprises the steps of:
1. Defining of local catalyst/catalysts on a silicon substrate by lithography.
2. Growing silicon nanowire from local catalyst. The growth parameters adjusted for catalytic wire growth.
3. Radial growing of other semiconductor, passivation, thin insulator or metal concentric layer around the nanowire (cladding layer).
4. Forming contacts on the PD nanwire and to the substrate and to other metal layers in a CMOS circuit.

The growth process can be varied in known ways, for example, to include heterostructures in the nanowires, provide reflective layers etc.

Depending on the intended use of the nanostructured PD, availability of suitable production processes, costs for materials etc., a wide range of materials can be used for the different parts of the structure. In addition, the nanowire based technology allows for defect free combinations of materials that otherwise would be impossible to combine. The III-V semiconductors are of particular interest due to their properties facilitating high speed and low power electronics. Suitable materials for the substrate include, but is not limited to: Si, GaAs, GaP, GaP:Zn, GaAs, InAs, InP, GaN, $Al_2O_3$, SiC, Ge, GaSb, ZnO, InSb, SOI (silicon-on-insulator), CdS, ZnSe, CdTe. Suitable materials for the nanowire 110 include, but is not limited to: Si, GaAs (p), InAs, Ge, ZnO, InN, GaInN, GaN AlGaInN, BN, InP, InAsP, GaInP, InGaP:Si, InGaP:Zn, GaInAs, AlInP, GaAlInP, GaAlInAsP, GaInSb, InSb. Possible donor dopants for e.g. GaP, Te, Se, S, etc, and acceptor dopants for the same material are Zn, Fe, Mg, Be, Cd, etc. It should be noted that the nanowire technology makes it possible to use nitrides such as SiN, GaN, InN and AlN, which facilitates fabrication of PDs detecting light in wavelength regions not easily accessible by conventional technique. Other combinations of particular commercial interest include, but is not limited to GaAs, GaInP, GaAlInP, GaP systems. Typical doping levels range from $10^{18}$ to $10^{20}$ A person skilled in the art is though familiar with these and other materials and realizes that other materials and material combinations are possible.

The appropriateness of low resistivity contact materials are dependent on the material to be deposited on, but metal, metal alloys as well as non-metal compounds like Al, Al—Si, $TiSi_2$, TiN, W, $MoSi_2$, PtSi, $CoSi_2$, $WSi_2$, In, AuGa, AuSb, AuGe, PdGe, Ti/Pt/Au, Ti/Al/Ti/Au, Pd/Au, ITO (InSnO), etc. and combinations of e.g. metal and ITO can be used.

The substrate is an integral part of the device, since it also contains the photodiodes necessary to detect light that has not been confined to the nanowire. The substrate in addition also contains standard CMOS circuits to control the biasing, amplification and readout of the PD as well as any other CMOS circuit deemed necessary and useful. The substrate include substrates having active devices therein. Suitable materials for the substrates include silicon and silicon-containing materials. Generally, each sensor element of the embodiments include a nanostructured PD structure comprise a nanowire, a cladding enclosing at least a portion of the nanowire, a coupler and two contacts.

The fabrication of the nanostructured PDs on silicon is possible to the degree that the nanowires are uniformly aligned the (111) direction normal to the substrates and essentially no nanowires are grown in the three declined (111) directions that also extends out from the substrate. The well aligned growth of III-V nanowires in predefined array structures on silicon substrates, is preferred for successful large scale fabrication of optical devices, as well as most other applications.

PD devices build on silicon nanowires are of high commercial interest due to their ability to detect light of selected wavelengths not possible with other material combinations. In addition they allow the design of a compound photodiode that allows the detection of most of the light that impinges on a image sensor.

The silicon nanowire of the embodiments disclosed herein could be made as follows. A substrate is provided which comprises silicon having a silicon dioxide surface. The surface can be modified with a surface treatment to promote adsorption of a gold nanoparticle. Onto this modified surface, the gold nanoparticle can be formed by deposition of a gold layer, followed by removal of the gold layer over regions other than desired location of the gold nanoparticle. The gold nanoparticle can be surface treated to provide for steric stabilization. In other words, tethered, sterically stabilized gold nanoparticles can be used as seeds for further synthesis of nanowires, wherein the gold nanoparticles are adsorbed to the modified silicon substrate. The degradation of diphenyl silane (DPS) to forms silicon atoms. These silicon atoms are introduced into the deep cavity in the stacking layers of the IC. The silicon atoms attach to the gold nanoparticle and a silicon nanowire crystallizes from the gold nanoparticle seed upon saturation of the gold nanoparticle with silicon atoms.

The nanowire could have a PN or PIN junction that induces a potential gradient in the nanowire. The PN or PIN junction could be formed by growing a nanowire and doping the nanowire core while it is growing as a PIN junction. For example, the doping of the nanowire could have two levels of doping to form N and P, or in other embodiments, the nanowire could comprise P, I and N regions to form a PIN photodiode. Yet, another possibility is doping the wire along its length in concentric circles to form P and N or P, I and N regions to form a PN or PIN photodiode. The PN or PIN junction nanowire (also referred to as a PN or PIN photodiode) is contacted at the appropriate points along PN or PIN junction nanowire using the various metal layers that are part of any device to detect the charge generated by the light induced carriers in the PN or PIN junction nanowire.

Figure 3:
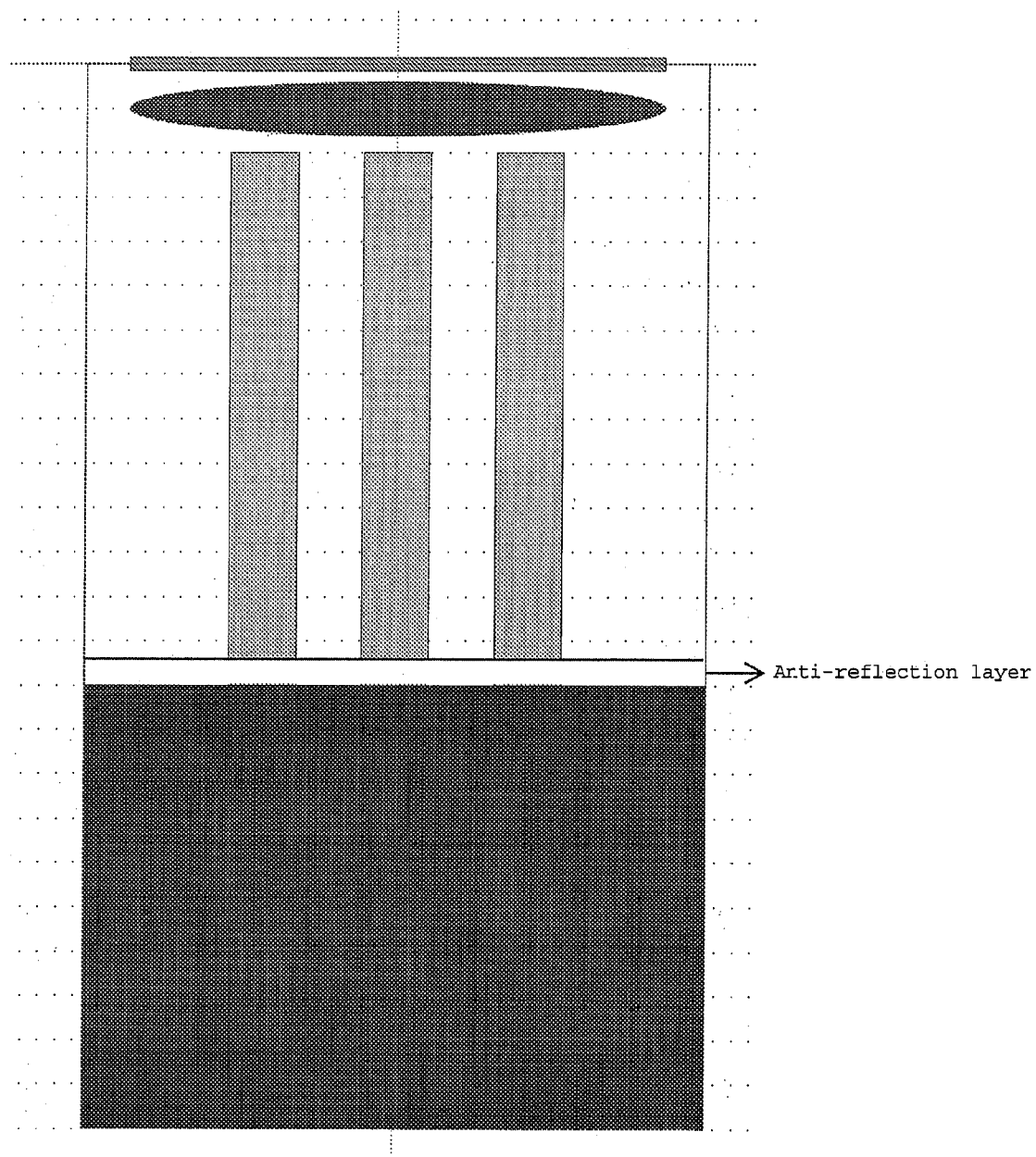
FIG. 3 shows an embodiment of an array of nanowires within a single cavity of the image sensor of an embodiment.

In other embodiments, there could be multiple nanowires in a single deep cavity as shown in FIG. 3 wherein at the bottom is a silicon substrate on which there is an array of nanowires over which is a coupler (shown as an oval), and over the coupler is a region (shown as rectangular box) through which light comes in to the coupler.

The recognition of color and luminance by the embodiments of the image sensors could be done by color reconstruction. Each compound pixel has complete luminance information obtained by combining its two complementary outputs. As a result, the same image sensor can be used either as a full resolution black and white or full color sensor.

The color reconstruction could be done to obtain full color information by the appropriate combination of two adjacent pixels, which could be one embodiment of a compound pixel, either horizontally or vertically. The support over which color information is obtained is less than the dimension of two pixels as opposed to 4 for the Bayer pattern.

Figure 4:
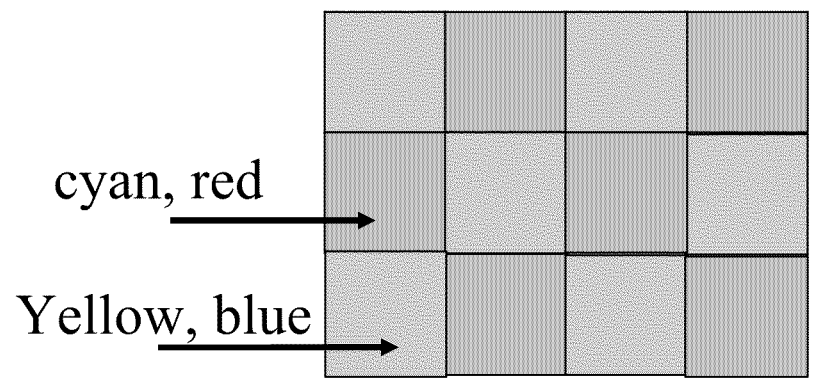
FIG. 4 shows a schematic of a top view of a device containing image sensors of the embodiments disclosed herein, each image sensor having two outputs representing the complementary colors.

Each physical pixel of a device containing an image sensor of the embodiments disclosed herein would have two outputs representing the complementary colors, e.g., cyan, red (C, R) designated as output type 1 or yellow, blue (Y, B) designated as output type 2 as shown in FIG. 4. These four outputs of two pixels of a compound pixel can be resolved to reconstruct a full color scene of an image viewed by a device containing the image sensors of the embodiments described herein.

Example 1

Angle Dependence an Image Sensor Having a Single and Multiple Nanowires

A nanowire capacitor-photodiode has the properties of converting incoming light into charge stored in the capacitor. The efficiency with which light is coupled into the nanowire, however, is dependent on the angle of the incident light. Simulations indicate that the efficiency decreases with increasing departure of the angle from normal incidence. Light that fails to couple to the nanowire could eventually end up either in the substrate or be reflected out of the cavity altogether. With increasing departure from normal incidence, the response of the nanowire decreases but that of the substrate increases. This could lead to errors to in scene color recognition and illumination, particularly for a non telecentric lens.

Figure 5:
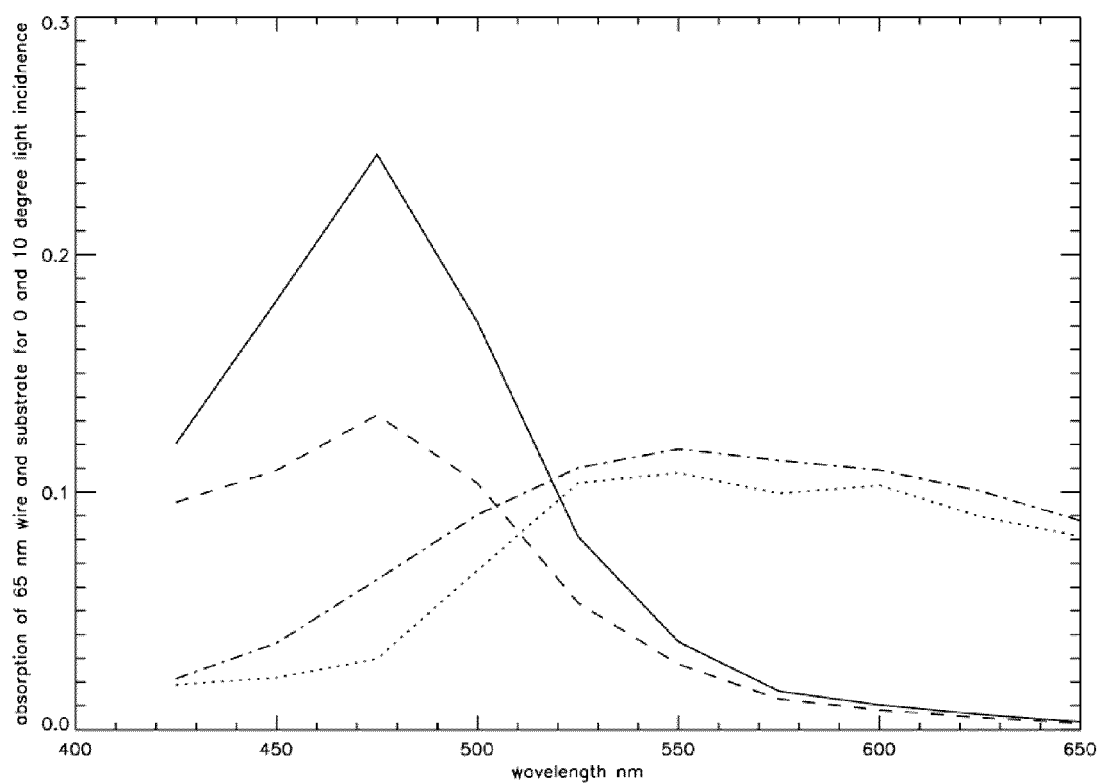
FIG. 5 shows a response of the single wire of diameter 65 nm in a 1200 nm cavity as a function of wavelength with illumination incident at 0 and 10 degrees from the vertical.
Figure 6:
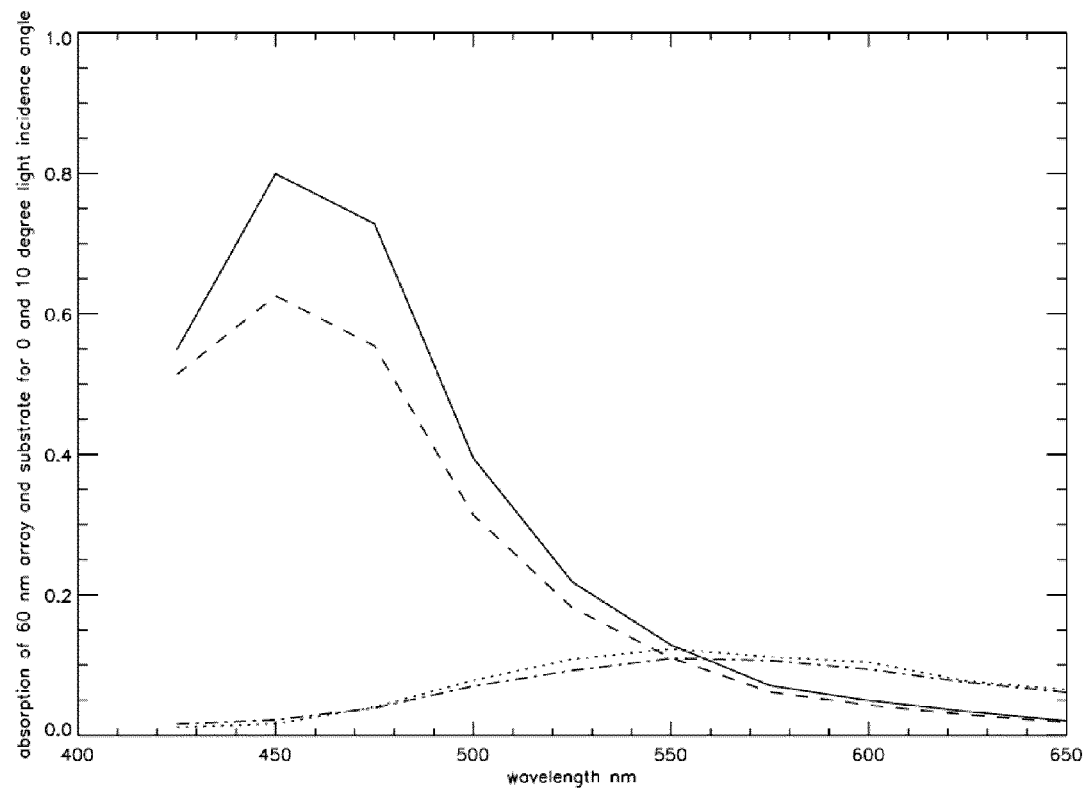
FIG. 6 shows a response of an array of 5 wires of diameter 60 nm in a 1200 nm cavity as a function of wavelength with illumination incident at 0 and 10 degrees from the vertical.

A nanowire array capacitor-photodiode could display a significantly reduced angular dependence in its response. In addition to optical response, the optimal number of nanowires in a single cavity could depend on the process and fabrication of the nanowire capacitor-photodiode. Simulations indicate five nanowires in a single cavity could dramatically reduce angular dependence as shown in FIGS. 5 and 6. The units of the y axis are arbitrary as the simulation results shown in FIGS. 5 and 6 is the show the relative change in the response as a function of wavelength with different angle of light incidence. The diameter of the cavity containing the single or array of nanowires whose simulation results are shown in FIGS. 5 and 6 was 1200 nm. Also, in arriving at the simulations whose results are shown in FIGS. 5 and 6, it was assumed that all light not absorbed by the nanowire would to be absorbed in the substrate.

FIG. 5 shows a plot entitled "wire_65 nm_angle_plot" simulating absorption in a 65 nm nanowire located concentrically in a cavity of 1200 nm and by the substrate. The solid line is the response of the single wire of diameter 65 nm as a function of wavelength with illumination incident in a perpendicular direction and the dashed line is the same response but for a wire illuminated at 10 degrees from vertical. The dotted line is the response of the substrate for vertical illumination and the dash dot line is the same for illumination at 10 degrees. The term response refers to the ability to absorb incident light.

FIG. 5 shows the following features of a single nanowire capacitor-photodiode in a cavity: (1) the response of the single nanowire has a maximum around 480 nm wavelength of light; (2) the response of the single nanowire changes substantially with a change in the angle of light incidence from perpendicular to the nanowire to 10 degrees from the perpendicular axis; (3) the response of the substrate has a maximum around 550 nm wavelength of light; and (4) the response of the substrate is greater for the angle of light incidence of 10 degrees from the perpendicular axis than for the angle of light incidence perpendicular to the nanowire.

FIG. 6 shows a plot entitled "array_60 nm_angle_plot." The solid line is the response of an array of 5 nanowires each of diameter 60 nm as a function of wavelength with illumination incident in a perpendicular direction and the dashed line is the same response but for an array illuminated at 10 degrees from vertical. The dotted line is the response of the substrate for vertical illumination and the dash dot line is the same for illumination at 10 degrees. The term response refers to the ability to absorb incident light.

The 5 nanowires were arranged in a diamond with 4 nanowires located at the four corners of the diamond and one nanowire located at the center of the diamond, which was also the center of the cavity of diameter 1200 nm. The distance between the central nanowire and each of the four corner nanowires was 300 nm.

FIG. 6 shows the following features of a single nanowire photodiode in a cavity: (1) the response of the single nanowire has a maximum around 480 nm wavelength of light; (2) the response of the single nanowire does not change substantially with a change in the angle of light incidence from perpendicular to the nanowire to 10 degrees from the perpendicular axis; (3) the response of the substrate has a maximum around 550 nm wavelength of light, but the magnitude of the response of the substrate is substantially smaller than that of the response of the substrate of a single nanowire capacitor-photodiode in a cavity; and (4) the response of the substrate is almost the same for the angle of light incidence of 10 degrees from the perpendicular axis as that for the angle of light incidence perpendicular to the nanowire.

Example 2

An Array of Nanowires with Anti-Reflective Material on the Substrate

In Example 1, the response of a single nanowire capacitor-photodiode in a cavity clearly demonstrates that a substantially portion of the light starting from about a wavelength of 450 nm has to be absorbed by the surface in the cavity. In short, an appropriate performance of the nanowire PD depends on all light not absorbed by the nanowire to be absorbed in the substrate.

Whenever a ray of light moves from one medium to another (for example, when light enters a sheet of glass after travelling through air), some portion of the light is reflected from the surface (known as the interface) between the two media. The strength of the reflection depends on the refractive indices of the two media as well as the angle of the surface to the beam of light. The exact value can be calculated using the Fresnel equations.

When the light meets the interface at normal incidence (perpendicularly to the surface), the intensity of light reflected is given by the reflection coefficient or reflectance, R:

$$R = \left(\frac{n_0 - n_S}{n_0 + n_S}\right)^2$$

where $n_0$ and $n_S$ are the refractive indices of the first and second media, respectively. The value of R varies from 0.0 (no reflection) to 1.0 (all light reflected) and is usually quoted as a percentage. Complementary to R is the transmission coefficient or transmittance, T. If absorption and scattering are neglected, then the value T is always 1-R. Thus if a beam of light with intensity I is incident on the surface, a beam of intensity RI is reflected, and a beam with intensity TI is transmitted into the medium.

Applying these principles to the embodiments of the invention, in an example, if the index of refraction of Si for red light is 4 and that of the cavity filled with $SiO_2$ is about 1.5, R would then be equal to about 0.2. This means that 20% of the incident power is reflected at the substrate and is not detected.

According to the embodiments of the invention, strategies for minimizing the reflection of incident light on the substrate of the cavity is to provide an anti-reflective material in or on the substrate of the cavity. An anti-reflective material could be in the form of a coating and acts to reduce the reflection at the surface, allowing a higher level of visible light transmission. Anti-reflective or antireflection (AR) coatings are a type of optical coating applied to the surface of optical devices to reduce reflection. This improves the efficiency of the system since less light is lost. The methods for implementing anti-reflective coatings include the use of alternating layers of a low-index material like silica and a higher-index material to obtain reflectivity as low as 0.1% at a single wavelength or over a range of wavelengths.

In one embodiment, the anti-reflective material could work near a single light frequency. Other embodiments could use a green antireflective coating, for example, on the substrate of the cavity containing the blue absorbing nanowire, and a red anti-reflective coating with a cyan absorbing nanowire.

Many AR coatings have transparent thin film structures with alternating layers of contrasting refractive index. Layer thicknesses are chosen to produce destructive interference in the beams reflected from the interfaces, and constructive interference in the corresponding transmitted beams. This makes the structure's performance change with wavelength and incident angle, so that color effects often appear at oblique angles. A wavelength range must be specified when designing or ordering such coatings, but good performance can often be achieved for a relatively wide range of frequencies: usually a choice of IR, visible, or UV is offered.

The simplest interference AR coating could be a single quarter-wave layer of transparent material whose refractive index is the square root of the substrate's refractive index. This theoretically gives zero reflectance at the center wavelength and decreased reflectance for wavelengths in a broad band around the center. By using alternating layers of a low-index material like silica and a higher-index material it is possible to obtain reflectivities as low as 0.1% at a single wavelength.

One embodiment of the AR coating could be ultraviolet anti-reflection (UAR) coating. This ultraviolet anti-reflection coating could reduce surface reflection from quartz, fused silica, semiconductor silicon substrates to less than 0.3% from 0.2 to 0.3 microns. UAR coatings are designed to promote effective transmission of light in the ultraviolet wavelengths.

Anti-reflective coatings include several different sub-layers comprising many different materials such as, but not limited to, $Al_2O_3$, $ZrO_3$, $MgF_2$, $SiO_2$, cryolite, LiF. $ThF_4$, $CeF_3$, $PbF_2$, ZnS, ZnSc, Si, Te, MgO, $Y_2O_3$, $Sc_2O_3$, SiO, $HfO_2$, $ZrO_2$, $CeO_2$, $Nb_2O_3$, $Ta_2O_5$, and $TiO_2$. The thickness of each sublayer is often related to an even whole number division of the wavelength of light that is most preferred to be transmitted through the coated material.

Another embodiment of an anti-reflective coating could be a treated silicon layer. An untreated silicon layer absorbs about 67.4 percent of light shone upon it—meaning that nearly one-third of that light is reflected away. In the embodiments of the invention, a silicon surface could be treated with a nanoengineered reflective coating such that the material could absorb 90 or more of the optical light directed onto the material. For example, the nanoengineered anti-reflective material of Lin disclosed in "Realization of a Near Perfect Antireflection Coating for Silicon Solar Energy," published in November 2008 by the journal *Optics Letters*, which is incorporated herein in its entirety by reference, absorbed 96.21 percent of light shone upon it.

The new coating could also successfully tackle the tricky challenge of angles. Typical antireflective coatings are engineered to transmit light of one particular wavelength. The new coating could stack multiple layers, for example seven layers, one on top of the other, in such a way that each layer enhances the antireflective properties of the layer below it. These additional layers also help to bend the flow of light to an angle that augments the coating's antireflective properties. This means that each layer not only transmits light, it also helps to capture any light that may have otherwise been reflected off of the layers below it.

For example, the seven layers, each with a height of 50 nanometers to 100 nanometers, could be made up of silicon dioxide and titanium dioxide nanorods positioned at an oblique angle such that light is captured between the nanorods. The nanorods could be attached to a silicon substrate via chemical vapor disposition. The new coating could be affixed to nearly any photovoltaic materials, including III-V multi-junction and cadmium telluride.

Example 3

Effect of Cavity Size on the Angle Dependence of a Single Nanowire

A nanowire capacitor-photodiode in a smaller cavity could display a significantly reduced angular dependence in its response when the ratio of a diameter of the cavity to a diameter of the nanowire is at less than about 10, preferably less than about 9, more preferably less than 8, and most preferably less than 7.

Figure 7:
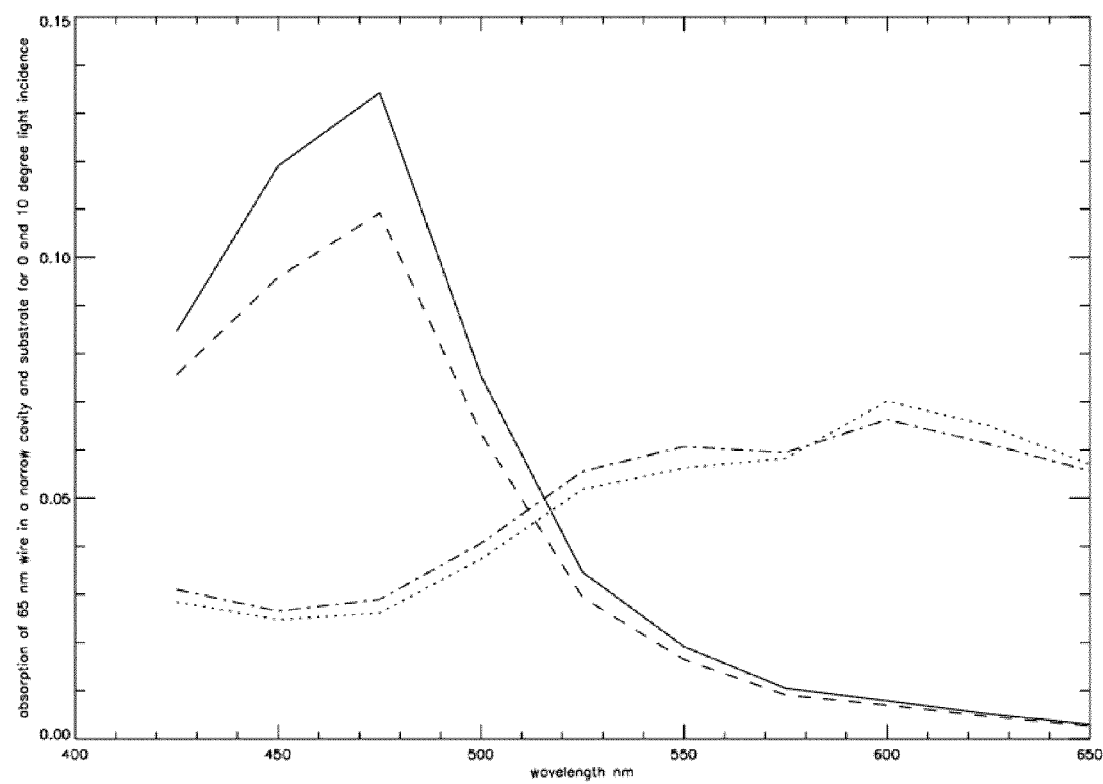
FIG. 7 shows a response of the single wire of diameter 65 nm in a 600 nm cavity as a function of wavelength with illumination incident at 0 and 10 degrees from the vertical.

Simulations indicate a nanowire of 65 nm in a single cavity of 600 nm could dramatically reduce angular dependence as shown in FIG. 7 as compared to the angular dependence of nanowire of 65 nm in a single cavity of 1200 nm shown in FIG. 5. In arriving at the simulations whose results are shown in FIGS. 5 and 7, it was assumed that all light not absorbed by the nanowire would to be absorbed in the substrate.

FIG. 7 shows a plot entitled "wire_65 nm_angle_plot" simulating absorption in a 65 nm nanowire located concentrically in a cavity of 600 nm and by the substrate. The solid line is the response of the single wire of diameter 65 nm as a function of wavelength with illumination incident in a perpendicular direction and the dashed line is the same response but for a wire illuminated at 10 degrees from vertical. The dotted line is the response of the substrate for vertical illumination and the dash dot line is the same for illumination at 10 degrees. The term response refers to the ability to absorb incident light.

FIG. 7 shows the following features of a single nanowire capacitor-photodiode in a cavity: (1) the response of the single nanowire has a maximum around 480 nm wavelength of light; (2) the response of the single nanowire does not change substantially with a change in the angle of light incidence from perpendicular to the nanowire to 10 degrees from the perpendicular axis; (3) the response of the substrate has a maximum around 600 nm wavelength of light; and (4) the response of the substrate is substantially the same for the angle of light incidence of 10 degrees from the perpendicular axis and for the angle of light incidence perpendicular to the nanowire.

By comparing FIGS. 5 and 7, one notices that the scale is different as there is less light (less photons) collected by the narrower cavity of 600 nm versus a larger cavity of 1200 nm and that the relative change between 0 degrees and 10 degrees is much smaller.

The foregoing detailed description has set forth various embodiments of the devices and/or processes via the use of diagrams, flowcharts, and/or examples. Insofar as such diagrams, flowcharts, and/or examples contain one or more functions and/or operations, it will be understood by those within the art that each function and/or operation within such diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to optical coupling to permit transmission of optical light, for example via an optical pipe or fiber, physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All references, including but not limited to patents, patent applications, and non-patent literature are hereby incorporated by reference herein in their entirety.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

I claim:

1. An image sensor comprising one or more upstanding nanowires on a substrate, the one or more nanowires being configured to transmit a first portion of an electromagnetic radiation beam incident on the sensor, and the substrate comprising an anti-reflective material that absorbs a second portion of the electromagnetic radiation beam incident on the sensor, wherein the first portion is substantially different from the second portion, wherein the anti-reflective material absorbs at least 68 percent of optical light incident on the anti-reflective material, and wherein the anti-reflective material does not disrupt electronic surface properties of epitaxial silicon to cause surface current leakage or provide sites for recombination of carriers generated by photons when the anti-reflective material is contacted with epitaxial silicon; wherein the first portion comprises electromagnetic radiation of wavelengths of light of a first color and the second portion comprises electromagnetic radiation of wavelengths of light of a second color wherein the second color is a complementary color of the first color; wherein diameters of the one or more nanowires are larger than $\lambda/2n_w$, wherein $\lambda$ are the wavelengths of light of the first color and $n_w$ is a refractive index of the one or more nanowires.

2. The sensor of claim 1, wherein the second portion comprises at least a portion of electromagnetic radiation that comes out from the nanowire.

3. The sensor of claim 1, wherein the anti-reflective material is in an anti-reflective layer on a front side of the substrate that is exposed to the electromagnetic radiation beam incident on the sensor.

4. The sensor of claim 1, wherein the nanowire is configured to separate wavelengths of the electromagnetic radiation beam incident on the nanowire at a selective wavelength.

5. The sensor of claim 1, wherein the sensor is configured to have an optical response of the nanowire that substantially resembles a human eye optical response.

6. The sensor of claim 1, wherein the sensor comprises a plurality of nanowires and is configured to have a substantially minor change in an optical response of the nanowire with a 10° change in a direction of the electromagnetic radiation beam incident on the sensor.

7. The sensor of claim 1, wherein the anti-reflective layer comprises a plurality of anti-reflective films configured to absorb electromagnetic radiation of a plurality of wavelengths.

8. The sensor of claim 1, wherein said one or more nanowires is configured to separate wavelengths of the electromagnetic radiation beam incident on said on or more nanowires through at a selective wavelength, the sensor further comprising a pair of photosensitive elements comprising a central photosensitive element and a peripheral photosensitive element, wherein the central photosensitive element is operably coupled to the nanowire and the peripheral photosensitive element is operably coupled to the substrate around the nanowire.

9. The sensor of claim 1, wherein the nanowire is configured to be an active element to detect wavelengths of electromagnetic radiation transmitted through the nanowire.

10. The sensor of claim 9, wherein the active element is configured to be a photodiode, a charge storage capacitor, or combinations thereof.

11. A device comprising the sensor of claim 8, wherein the device is an image sensor.

12. The device of claim 11, wherein the nanowire comprises a waveguide.

13. The device of claim 12, further comprising a passivation layer around the waveguide.

14. The device of claim 2, further comprising a metal layer around the waveguide.

15. The device of claim 11, wherein the device comprises no color or IR filter.

16. The device of claim 11, further comprising a cladding surrounding the nanowire, wherein the nanowire has a nanowire index of refraction ($n_1$), and the cladding has a cladding index of refraction ($n_2$), wherein $n_1>n_2$, $n_1=n_2$, or $n_1<n_2$.

17. The device of claim 11, wherein the nanowire comprises a waveguide and wherein the selective wavelength is a function of the diameter of the waveguide.

18. The device of claim 12, further comprising at least a pair of metal contacts with at least one of the metal contacts being contacted to the waveguide.

19. A device comprising the sensor of claim 9, wherein the device is an image sensor.

20. The device of claim 19, wherein the nanowire comprises a waveguide and wherein the waveguide is configured to convert energy of the electromagnetic radiation transmitted through the waveguide and to generate excitons.

21. The device of claim 19, wherein the nanowire comprises a waveguide and wherein the waveguide comprises a PIN junction that is configured to detect excitons generated in the waveguide.

22. The device of claim 19, wherein the nanowire comprises a waveguide and further comprising an insulator layer around the waveguide and a metal layer around the insulator layer to form a capacitor that is configured to collect excitons generated in the waveguide and store charge in the capacitor.

23. The device of claim 19, wherein the active element is configured to be a capacitor; wherein the nanowire comprises a waveguide, the device further comprising a metal layer around the waveguide and metal contacts that connect to the metal layer and the waveguide to control and detect charge stored in the capacitor.

24. The device of claim 19, further comprising a cladding around the nanowire, and wherein the substrate comprises a peripheral photosensitive element, wherein the peripheral photosensitive element is operably coupled to the cladding.

25. The device of claim 19, wherein the substrate comprises an electronic circuit.

26. The device of claim 19, further comprising a lens structure or an optical coupler over the nanowire, wherein the lens structure or the optical coupler is operably coupled to the nanowire.

27. The device of claim 19, further comprising a stack surrounding the nanowire, the stack comprising metallic layers embedded in dielectric layers.

28. The device of claim 27, wherein a surface of the stack comprises a reflective surface.

29. The sensor of claim 1, wherein the anti-reflective material is not located on the nanowire or on a back-side of the substrate opposite to a front side of the substrate that is exposed to the electromagnetic radiation beam incident on the sensor.

30. The sensor of claim 8, wherein a wall surface of the nanowire has a reflective surface.

31. The sensor of claim 9, wherein a wall surface of the of the nanowire has reflective surface.

32. The sensor of claim 1, wherein the anti-reflective material absorbs at least about 90 percent of optical light incident on the anti-reflective material.

33. The sensor of claim 1, wherein the anti-reflective material reduces a surface leakage current.

34. The sensor of claim 1, wherein the nanowires are located so as to create a regular or semi-regular tessellation wherein a shape is repeated over a plane without any gaps or overlaps.

35. The sensor of claim 34, wherein the regular tessellation is a triangular tessellation, a square tessellation, a hexagonal tessellation or combinations thereof.

36. The sensor of claim 1, further comprising a reflective layer under the nanowires.

37. The sensor of claim 1, wherein the substrate is a substrate of a cavity, and the cavity has a diameter of about 600 nm.

38. A method of sizing a cavity of an image sensor comprising one or more upstanding nanowires on a substrate of the cavity, the one or more nanowires being configured to transmit a first portion of an electromagnetic radiation beam incident on the sensor, wherein the substrate absorbs a second portion of the electromagnetic radiation beam incident on the sensor, and wherein the first portion is substantially different from the second portion, the method comprising changing a ratio of a diameter of the cavity to a diameter of the one or more nanowires such that there is a substantially minor change in an optical response of the one or more nanowires with a 10° change in a direction of the electromagnetic radiation beam incident on the sensor.

39. The method of claim 38, wherein the ratio of the diameter of the cavity to the diameter of the nanowire is less than 10.

40. The method of claim 38, wherein the ratio of the diameter of the cavity to the diameter of the nanowire is less than 7.

* * * * *